US011204831B2

United States Patent
Kumano et al.

(10) Patent No.: US 11,204,831 B2
(45) Date of Patent: Dec. 21, 2021

(54) MEMORY SYSTEM

(71) Applicant: KIOXIA CORPORATION, Tokyo (JP)

(72) Inventors: Yuta Kumano, Kawasaki Kanagawa (JP); Hironori Uchikawa, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 15 days.

(21) Appl. No.: 16/804,940

(22) Filed: Feb. 28, 2020

(65) Prior Publication Data

US 2021/0081275 A1 Mar. 18, 2021

(30) Foreign Application Priority Data

Sep. 12, 2019 (JP) .............................. JP2019-166652

(51) Int. Cl.
*G06F 11/10* (2006.01)
*H03M 13/15* (2006.01)

(52) U.S. Cl.
CPC ....... *G06F 11/1068* (2013.01); *H03M 13/152* (2013.01); *H03M 13/1515* (2013.01)

(58) Field of Classification Search
CPC .................................................. G06F 11/1068
USPC ................................ 714/764, 763, 765, 767
See application file for complete search history.

(56) References Cited

U.S. PATENT DOCUMENTS

| 8,230,309 | B2* | 7/2012 | Ito ..................... G11B 20/1803 714/794 |
| 10,205,469 | B2 | 2/2019 | Kumar et al. |
| 2017/0288699 | A1* | 10/2017 | Yang ..................... H03M 13/45 |
| 2019/0087107 | A1* | 3/2019 | Watanabe ............. G06F 3/0679 |
| 2019/0087265 | A1 | 3/2019 | Kifune et al. |
| 2019/0220348 | A1* | 7/2019 | Kokubun ............ G06F 11/1012 |
| 2020/0301777 | A1* | 9/2020 | Kifune ................ G06F 11/1012 |

FOREIGN PATENT DOCUMENTS

| JP | 3567733 B2 | 9/2004 |
| JP | 2019-125910 A | 7/2019 |

\* cited by examiner

*Primary Examiner* — Fritz Alphonse
(74) *Attorney, Agent, or Firm* — Kim & Stewart LLP

(57) ABSTRACT

A memory system includes a nonvolatile memory and a memory controller. The nonvolatile memory has data encoded with an error correction code stored therein. The memory controller reads data from the nonvolatile memory, calculates likelihood information from the read data and an LLR table for calculating the likelihood information, determines a parameter for a decoding process of the read data based on the likelihood information, executes the decoding process based on the determined parameter, and outputs a decoding result obtained by the decoding process.

20 Claims, 17 Drawing Sheets

MEMORY SYSTEM

CROSS-REFERENCE TO RELATED APPLICATION(S)

This application is based upon and claims the benefit of priority from Japanese Patent Application No. 2019-166652, filed Sep. 12, 2019, the entire contents of which are incorporated herein by reference.

FIELD

Embodiments described herein relate generally to a memory system.

BACKGROUND

In a memory system, data is subjected to error correction coding and the error correction coded data is stored in order to enable error correction. For that reason, when data stored in the memory system is read, decoding is performed on the data subjected to error correction coding.

DETAILED DESCRIPTION

Figure 1:
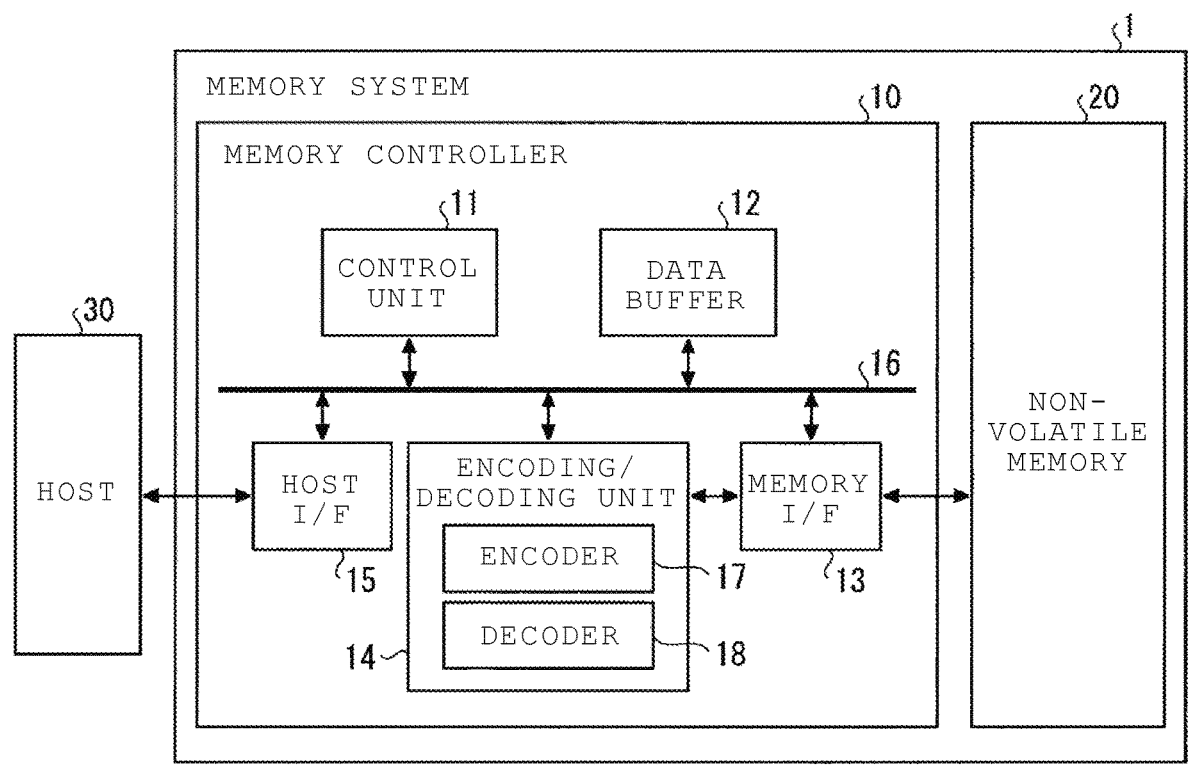
FIG. 1 is a block diagram illustrating a configuration example of a memory system according to a first embodiment.

Embodiments provide a memory system capable of improving error correction capability.

In general, according to one embodiment, there is provided a memory system including a nonvolatile memory and a memory controller. The nonvolatile memory has data encoded with an error correction code stored therein. The memory controller reads data from the nonvolatile memory, calculates likelihood information from the read data and an LLR (log-likelihood ratio) table for calculating the likelihood information, determines a parameter for a decoding process of the read data based on the likelihood information, executes the decoding process based on the determined parameter, and outputs a decoding result obtained by the decoding process.

Hereinafter, a memory system according to embodiments will be described in detail with reference to the accompanying drawings. The present disclosure is not limited by the following embodiments.

In describing the embodiments, terms are defined as follows.

A "communication path" is a probabilistic model, which can be referred to as "stress," that represents the influence of noise on a write value (also referred to as transmission value) x, and is characterized by a communication path matrix. Factors that characterize the communication path matrix may include so-called program disturb, data retention deterioration, read disturb, and temperature crossing.

"Likelihood" is a conditional probability $P(y|x)$ at which an output value (also referred to as a received value) y of a communication path is obtained when a certain write value x is given.

A "communication path matrix" is a matrix in which likelihood is described for all (x, y) pairs.

A "log likelihood ratio (LLR)" is information representing likelihood when a stored bit is "0" and the likelihood when the stored bit is "1" by a logarithmic ratio, and is also referred to as likelihood information and an LLR value.

An "LLR table" is a table indicating the correspondence between the output value y of the communication path and the LLR that is an input of a decoder. Accordingly, a value $\ln[P(y|x=0)/P(y|x=1)]$ obtained from the communication path matrix is the LLR value corresponding to the output value y. Generally, different LLR tables are prepared for different communication path matrices.

A "default LLR table" is an LLR table used by default. As this default LLR table, for example, an LLR table is used which is obtained from a communication path that is likely to be used typically, while corrections in various communication paths are assumed.

An "ECC frame" is a data block for the decoder to operate, and is a data block for reconstructing a code word from a sequence of received values.

An "estimated write value of a decoding result (also referred to as an estimated value) k" is an estimated write value that is an output of the decoder. Accordingly, at the end of decoding, a sequence {k} of estimated write values k corresponding to the ECC frame is obtained. Here, "success of decoding" means that a sequence {x} of answers and a sequence {k} of decoding results are completely unique. On the other hand, "failure of decoding" means that a point where x≠k occurs in the ECC frame, and the sequences {x} and {k} do not match. To truly know the success or failure of decoding, the sequence of answers must be known. Since the decoder does not know the sequence of answers, the decoder does not know the success or failure of true decoding, but has estimation information on the success or failure of decoding. In the context of the following description of decoding, a "success or failure of decoding" means success or failure of decoding estimated by the decoder.

A "true communication path matrix" is a communication path matrix having a conditional probability P(y|x) based on x, which is an accurate answer, as an element. On the other hand, an "estimated communication path matrix" is a communication path matrix having a conditional probability P(y|k) using the estimated write value k output from the decoder as an element.

An "estimated LLR table" is an LLR table based on the estimated communication path matrix.

A "symbol" is at least one constituent unit of an error correction code. One symbol may correspond to, for example, 1-bit (element of a binary field) or an alphabetic element such as a finite field other than the binary field.

First Embodiment

First, a memory system according to a first embodiment will be described in detail with reference to the drawings. FIG. 1 is a block diagram illustrating a schematic configuration example of the memory system according to the first embodiment. As illustrated in FIG. 1, a memory system 1 includes a memory controller 10 and a nonvolatile memory 20. The memory system 1 may be connected to a host 30, and in FIG. 1, a state where the memory system 1 is connected to the host 30 is illustrated. The host 30 may be an electronic device such as a personal computer or a portable terminal.

The nonvolatile memory 20 is a nonvolatile memory that stores data in a nonvolatile manner, and is, for example, a NAND flash memory (hereinafter, simply referred to as a NAND memory). In the following description, a case where a NAND memory is used as the nonvolatile memory 20 will be exemplified, while a storage device other than the NAND memory such as a three-dimensional structure flash memory, a resistive random access memory (ReRAM), or a ferroelectric random access memory (FeRAM) may also be used as the nonvolatile memory 20. It is not essential that the nonvolatile memory 20 is a semiconductor memory, and this embodiment may be applied to various storage media other than a semiconductor memory.

The memory system 1 may include various memory systems including the nonvolatile memory 20, such as a so-called solid state drive (SSD) or a memory card in which the memory controller 10 and the nonvolatile memory 20 are configured as one package.

The memory controller 10 controls writing to the nonvolatile memory 20 according to a write request from the host 30. The memory controller 10 controls reading from the nonvolatile memory 20 according to a read request from the host 30. The memory controller 10 is a semiconductor integrated circuit configured as a system on a chip (SoC), for example. The memory controller 10 includes a host I/F (host interface) 15, a memory I/F (memory interface) 13, a control unit 11, an encoding/decoding unit (codec) 14, and a data buffer 12. The host I/F 15, the memory I/F 13, the control unit 11, the encoding/decoding unit 14, and the data buffer 12 are connected to each other via an internal bus 16. A part or all of the operation of each component of the memory controller 10 described below may be implemented by a central processing unit (CPU) executing firmware, or may be implemented by hardware.

The host I/F 15 performs processing conforming to the interface standard with the host 30, and outputs a command and user data to be written that is received from the host 30, and the like to the internal bus 16. The host I/F 15 transmits user data read from the nonvolatile memory 20, a response from the control unit 11, and the like to the host 30.

The memory I/F 13 performs a write operation to the nonvolatile memory 20 based on an instruction from the control unit 11. The memory I/F 13 performs a read operation from the nonvolatile memory 20 based on the instruction from the control unit 11.

The control unit 11 comprehensively controls each component of the memory system 1. When receiving a command from the host 30 via the host I/F 15, the control unit 11 performs control according to the command. For example, the control unit 11 instructs the memory I/F 13 to write user data and parity (that includes one or more bits of data) to the nonvolatile memory 20 according to a command from the host 30. The control unit 11 instructs the memory I/F 13 to read user data and parity from the nonvolatile memory 20 according to a command from the host 30.

When receiving a write request from the host 30, the control unit 11 determines a storage area (also referred to as memory area) on the nonvolatile memory 20 for user data accumulated in the data buffer 12. That is, the control unit 11 manages a write destination of user data. The correspondence between a logical address of user data received from the host 30 and a physical address indicating the storage area in which the user data is stored in the nonvolatile memory 20 is stored as an address conversion table.

When receiving a read request from the host 30, the control unit 11 converts the logical address specified by the read request into a physical address using the address conversion table described above, and instructs the memory I/F 13 to read data from the physical address.

In a NAND memory, writing and reading are generally performed in data units called pages, and erasing is performed in data units called blocks. In this embodiment, a plurality of memory cells connected to the same word line is referred to as a memory cell group. When the memory cell is a single level cell (SLC), one memory cell group corresponds to one page. When the memory cell is a multi-level cell (MLC), one memory cell group corresponds to a plurality of pages. In the present disclosure, the MLC includes a triple level cell (TLC), a quad level cell (QLC), and the like. Each memory cell is connected to a word line and also to a bit line. Accordingly, each memory cell may be identified by an address for identifying the word line and an address for identifying the bit line.

The data buffer 12 temporarily stores user data received from the host 30 by the memory controller 10 until the user data is stored in the nonvolatile memory 20. The data buffer 12 temporarily stores the user data read from the nonvolatile memory 20 until the user data is transmitted to the host 30. For the data buffer 12, for example, a general purpose memory such as a static random access memory (SRAM) or a dynamic random access memory (DRAM) may be used. The data buffer 12 may be mounted outside the memory controller 10 and not a part of the memory controller 10.

User data transmitted from the host 30 is transferred to the internal bus 16 and temporarily stored in the data buffer 12.

The encoding/decoding unit 14 encodes user data stored in the nonvolatile memory 20 to generate a code word. The encoding/decoding unit 14 decodes a received word read from the nonvolatile memory 20 to restore the user data back to its unencoded state. Therefore, the encoding/decoding unit 14 includes an encoder 17 and a decoder 18. Data encoded by the encoding/decoding unit 14 may include control data used inside the memory controller 10 in addition to user data.

A write operation of this embodiment will be described. When writing to the nonvolatile memory 20, the control unit 11 instructs the encoder 17 to encode user data. In this case, the control unit 11 determines a storage location (storage address) of the code word in the nonvolatile memory 20, and instructs the memory I/F 13 also on the determined storage location.

Based on an instruction from the control unit 11, the encoder 17 encodes user data on the data buffer 12 to generate a code word. As an encoding method, for example, an encoding method using an algebraic code such as a Bose-Chaudhuri-Hocquenghem (BCH) code and a Reed-Solomon (RS) code, an encoding method using these codes as component codes in the row and column directions (product code and the like), and an encoding method using codes based on sparse graphs such as a low-density parity-check (LDPC) code may be employed. The memory I/F 13 performs control to store the code word in the storage location on the nonvolatile memory 20 instructed by the control unit 11.

A process at the time of reading data from the nonvolatile memory 20 of this embodiment will be described. When reading data from the nonvolatile memory 20, the control unit 11 designates an address on the nonvolatile memory 20 and instructs the memory I/F 13 to read. The control unit 11 instructs the decoder 18 to start decoding. The memory I/F 13 reads a received word from a designated address in the nonvolatile memory 20 according to an instruction from the control unit 11 and inputs the read received word to the decoder 18. The decoder 18 decodes the received word read from the nonvolatile memory 20.

Figure 2:
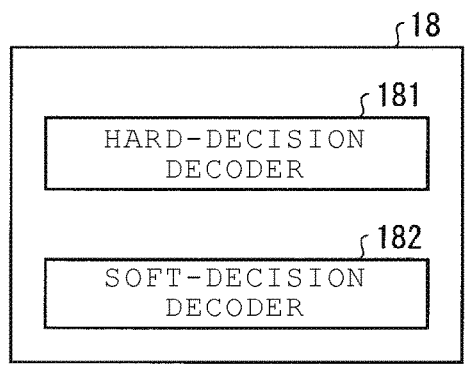
FIG. 2 is a block diagram illustrating a configuration example of a decoding unit according to the first embodiment.

The decoder 18 decodes the received word read from the nonvolatile memory 20. FIG. 2 is a block diagram illustrating a configuration example of the decoding unit according to this embodiment. As illustrated in FIG. 2, the decoder 18 includes a hard-decision decoder 181 executing hard-decision decoding that receives a hard-decision value as an input and outputs a hard-decision value as a result and a soft-decision decoder 182 executing soft-decision decoding that receives a soft-decision value as an input and outputs a soft-decision value as a result. In general, the soft-decision decoding is characterized by higher error correction capability but longer processing time than the hard-decision decoding. Thus, for example, a configuration in which the hard-decision decoder 181 first executes hard-decision decoding and the soft-decision decoder 182 executes soft-decision decoding when the hard-decision decoding cannot be executed may be adopted. However, this embodiment is not limited to such a configuration, and for example, the hard-decision decoder 181 may be omitted.

Figure 3:
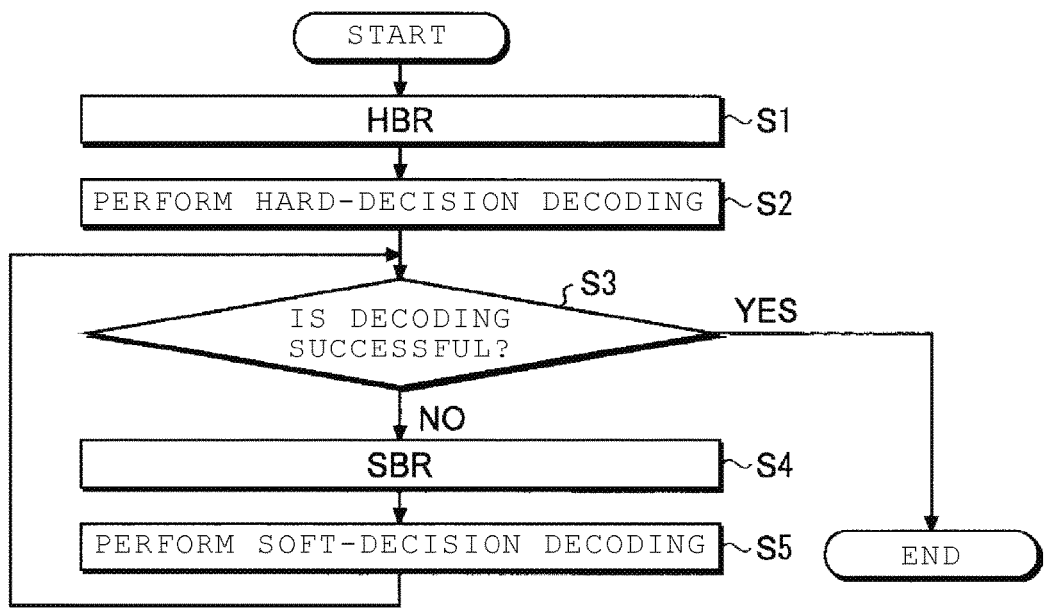
FIG. 3 is a flowchart illustrating an example of a data read operation according to the first embodiment.

FIG. 3 is a flowchart illustrating an example of a data read operation according to the first embodiment. The control unit 11 instructs the memory I/F 13 to read data from the nonvolatile memory 20 by hard bit read (HBR) by designating an address to be read, and in response to this, the memory I/F 13 executes the hard bit read (step S1). The hard bit read is a reading method in which each bit constituting the data to be read is read as a received word having a hard-decision value of 0 or 1. The read received word having the hard-decision value is input to the decoder 18 of the encoding/decoding unit 14 via the internal bus 16, for example.

When the nonvolatile memory 20 is the NAND memory, electrons are injected so that the number of electrons (charge amount) of a floating gate corresponds to one of a plurality of distributions (threshold voltage distributions) according to a write value x, when writing data. Here, in order to simplify the description, an example of a single level cell (SLC) in which one memory cell stores 1 bit will be described. In the case of SLC, one of two distributions corresponds to 0, and the other corresponds to 1. When a voltage is applied to the memory cell, a current flows when a voltage equal to or higher than a voltage value corresponding to the charge amount of the memory cell is applied, and no current flows when a voltage less than the voltage value is applied. Accordingly, a voltage serving as the boundary is determined for each memory cell according to the charge amount of the memory cell. Here, the voltage value determined according to the charge amount of the memory cell is referred to as a threshold voltage. In the initial state, charges are injected so as to correspond to one of the two threshold voltage distributions, and when reading data, a reference read voltage (also referred to as a reference read level) that separates the two threshold voltage distributions is applied to the memory cell, thereby capable of determining whether the data stored in the memory cell is 1 or 0.

In the hard bit read, the reference read voltage is applied to the memory cell to determine whether the data stored in the memory cell is 1 or 0, and the determined result is output as the received value y. The read voltage applied at the time of hard bit read may be changed from the reference read voltage.

Description will be made by referring back to FIG. 3. The control unit 11 instructs the decoder 18 to perform hard-decision decoding, and in response to this, the hard-decision decoder 181 of the decoder 18 performs the hard-decision decoding on the received word (step S2). Specifically, the hard-decision decoder 181 performs decoding such as limit distance decoding on the received word. However, the hard-decision decoding performed by the hard-decision decoder 181 is not limited to limit distance decoding, and may be any hard-decision decoding.

After step S2, the hard-decision decoder 181 determines whether or not decoding is successful, and notifies the control unit 11 of the determination result. Based on the notification from the hard-decision decoder 181, the control unit 11 determines whether or not the decoding is successful (step S3), and when it is determined that the decoding is successful (YES in step S3), the read operation ends.

On the other hand, when it is determined that the decoding fails (NO in step S3), the control unit 11 designates a read address and instructs the memory I/F 13 to read the data from the non-volatile memory 20 with by soft bit read (SBR), and in response to this, the memory I/F 13 executes the soft bit read in which the data stored in each memory cell is read as the received value y including the result of reading even at one or more read voltages that are set at a predetermined step size with respect to the reference read voltage used in the hard bit read (step S4). The read received value y is input to the decoder 18 of the encoding/decoding unit 14 via the internal bus 16 as a sequence {y} of units of ECC frames, for example.

In step S5, the control unit 11 instructs the decoder 18 to perform soft-decision decoding, and in response to this, the soft-decision decoder 182 of the decoder 18 executes soft-decision decoding on the sequence {y} of received values y input in units of ECC frames (step S5). Thereafter, this operation returns to step S3. Details of the soft-decision decoding according to this embodiment will be described in detail next.

In the soft-decision decoding, there are various parameters (decoding parameters) that determine the operation of soft-decision decoding, but the parameters that maximize the decoding performance differ depending on the communication path (stress situation). Since it is difficult to prepare individual parameters according to the communication path, in general, a single parameter optimized in advance (offline) is often used.

In contrast, in this embodiment, parameters are adaptively (online) determined according to the communication path. With this configuration, it becomes possible to further improve correction capability and reduce an amount of calculation.

Figure 4:
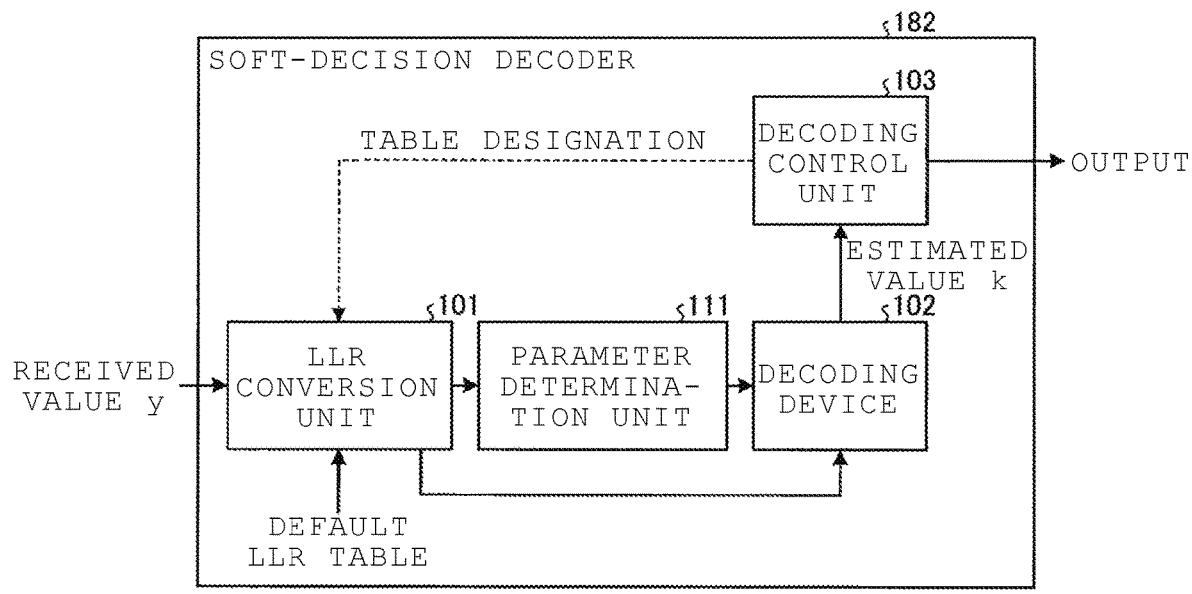
FIG. 4 is a block diagram illustrating an example of a more detailed configuration of a soft-decision decoding unit according to the first embodiment.

FIG. 4 is a block diagram illustrating an example of a more detailed configuration of the soft-decision decoder 182 according to this embodiment. As illustrated in FIG. 4, the soft-decision decoder 182 includes an LLR conversion unit 101, a parameter determination unit 111, a decoding device 102, and a decoding control unit 103.

The decoding control unit 103 controls a decoding process. For example, the decoding control unit 103 designates an LLR table to be used for the decoding device 102. In this embodiment, the decoding control unit 103 designates a default LLR table. The decoding control unit 103 receives a sequence {k} of estimated values k in units of ECC frames as a decoding result from the decoding device 102. Information obtained after decoding, such as whether decoding succeeds or fails, is also input to the decoding control unit 103. Then, the decoding control unit 103 controls output to the outside according to whether the decoding succeeds or fails.

The LLR conversion unit 101 converts the received value y read and input from the nonvolatile memory 20 into an LLR value using the LLR table designated by the decoding control unit 103. Specifically, the sequence {y} of received values y read from the nonvolatile memory 20 is input to the LLR conversion unit 101. The LLR conversion unit 101 receives a default LLR table used for conversion between the received value y and the LLR value. Furthermore, the LLR conversion unit 101 also receives designation information of the LLR table to be used from the decoding control unit 103. Then, the LLR conversion unit 101 outputs a sequence of LLR values obtained by converting the received value y using the LLR table designated by the decoding control unit 103 to the parameter determination unit 111 and the decoding device 102.

The parameter determination unit 111 determines a parameter of a decoding process to be executed by the decoding device 102 based on an input sequence of LLR values. In the following, as an example of the decoding method of the soft-decision decoder 182, a case will be described in which a decoding method in which symbol values are inverted (flip) to execute decoding is adopted and a range (flip region) of symbols to be flipped is determined as a parameter. The determination of the flip region includes, for example, determining the start position and size of the flip region, or the start position and end position of the flip region. In the decoding method that performs flipping, a symbol to be flipped is determined from the input LLR value and the flip region, and decoding is executed.

Such decoding methods include ordered statistics decoding (OSD) and Chase decoding. The decoding method may be repetitive decoding that repeatedly executes at least one of the OSD and Chase decoding. Applicable decoding methods are not limited to the OSD and Chase decoding, and other decoding methods that perform flipping may be used. The parameter determination unit 111 may determine a parameter other than the flip region. Details of a parameter determination method will be described later.

The decoding device 102 calculates information related to decoding and a sequence {k} of estimated values k from the sequence of LLR values in units of ECC frames. Specifically, the decoding device 102 receives the sequence of LLR values from the LLR conversion unit 101 and receives a parameter determined from the parameter determination unit 111. The decoding device 102 executes the decoding process on the sequence of LLR values according to the input parameters. A sequence corresponding to the ECC frame is input to the decoding device 102 by one decoding. Then, the decoding device 102 outputs the sequence {k} of estimated value k obtained by decoding the input sequence of LLR values to the decoding control unit 103. The decoding device 102 outputs the sequence {k} corresponding to the ECC frame as a result of one decoding. The decoding device 102 also outputs information obtained by decoding, such as success or failure of decoding, to the decoding control unit 103.

Figure 5:
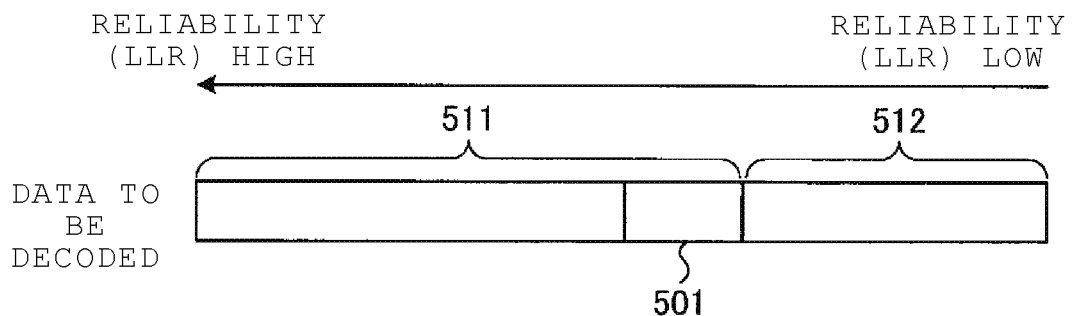
FIG. 5 is a diagram illustrating an example of a flip region used in ordered statistics decoding.

Next, details of the OSD will be described. FIG. 5 is a diagram illustrating an example of a flip region used in the OSD. In the OSD, a sort process, a phase 0 process, a phase n processing (n is an integer of more than or equal to 1), and the like are executed.

The sorting process is a process of sorting an input sequence of the LLR values by the absolute value of the LLR value and dividing the sequence of LLR values into most reliable basis (MRB) including an LLR value having a relatively large LLR value (high reliability) and low reliable basis (LRB) including an LLR value having a relatively small LLR value (low reliability). In FIG. 5, an example in which the sequence of LLR values is divided into MRB 511 and LRB 512 is illustrated.

In the phase 0 process, a process using the LRB is executed. In the phase n process, a flip region is determined in the MRB, n bits included in the flip region are flipped, and decoding is executed. In the phase n process, as illustrated in FIG. 5, the flip region 501 is determined as a region including a plurality of LLR values arranged in ascending order of reliability in the MRB.

The correction capability increases as the size of the flip region increases, while the amount of calculation increases accordingly. In the phase n process, flipping and decoding are executed for each n-bit combinations (for example, all n-bit combinations) in the flip region. For that reason, as the value "n" increases, the amount of calculation increases significantly.

As a method for determining the size of the flip region, for example, there exists a method for determining an optimum value (fixed value) considering the required correction capability and calculation amount as the size of the flip region. However, in such a method, for example, even when the number of bits with low reliability is relatively small, bits having the same size as that when the number of bits with low reliability is relatively large are flipped. For that reason, there are cases where the correction capability is reduced and an unnecessary increase in calculation amount is caused. When there are a relatively large number of bits with low reliability, if more bits are flipped, the correction capability may increase, but such a function cannot be achieved by a method in which the size of the flip area is fixed.

Therefore, in this embodiment, the flip region is determined adaptively (dynamically) and flipping is executed only in the region with lower reliability (high error probability), so that the increase in the calculation amount is prevented without reducing the correction capability in the phase n process.

Figure 6:
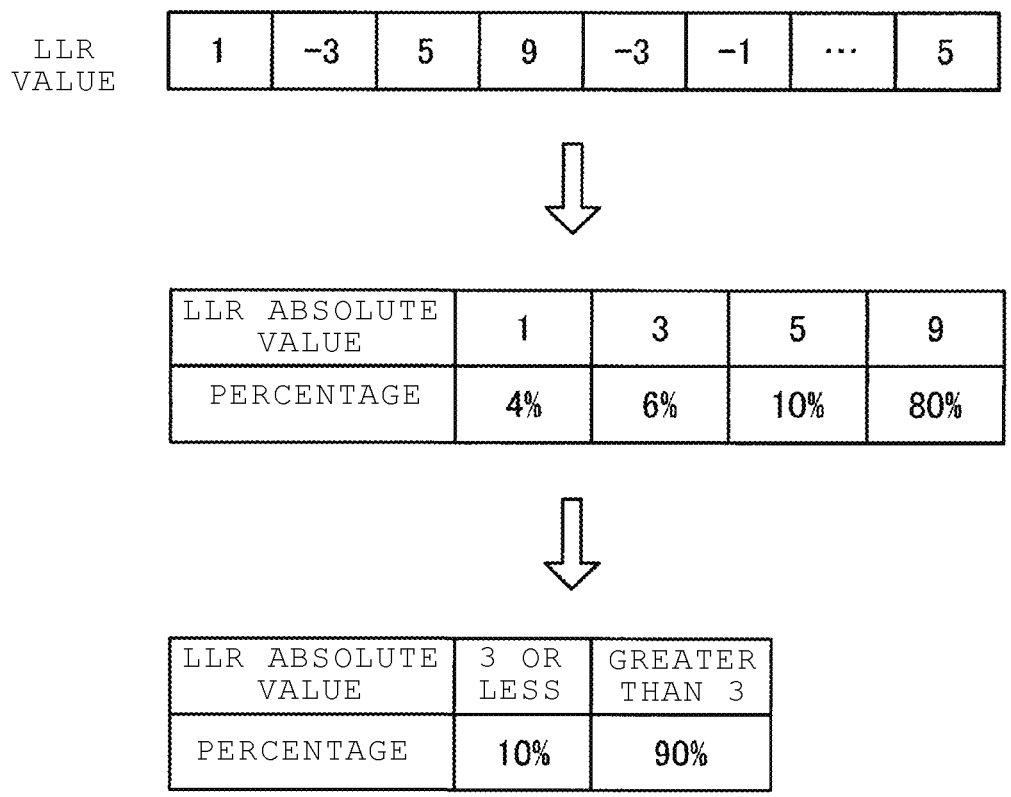
FIG. 6 is a diagram illustrating an example of a flip region determination method.

FIG. 6 is a diagram illustrating an example of a flip region determination method. The parameter determination unit 111 obtains the number of each of absolute values (LLR absolute values) of LLR values from the input sequence of LLR values, and calculates a percentage of the number of each of absolute values to the total number of LLR values. In FIG. 6, an example is illustrated in which the percentage of the LLR absolute values of 1, 3, 5, and 9 are 4%, 6%, 10%, and 80%, respectively.

The parameter determination unit 111 further contracts the obtained percentage into a percentage of an LLR absolute value equal to or less than a threshold TH and a percentage of an LLR absolute value greater than the threshold TH. In FIG. 6, an example in which, when the threshold TH is 3, the percentage is contracted to 10%, which is the percentage of LLR absolute value where the threshold TH is equal to or less than 3, and is contracted to 90%, which is the percentage of LLR absolute value where the threshold TH is greater than 3 is illustrated.

The parameter determination unit 111 determines the size of the flip region by subtracting the size of the LRB from an expected value of the number of LLR values less than or equal to the threshold TH in the input sequence of LLR values. The expected value of the number of LLR values less than or equal to the threshold TH may be calculated by a product of the percentage of the LLR absolute values less than or equal to the threshold TH and a code length of the error correction code. That is, the parameter determination unit 111 calculates the size of the flip region by "code length×(percentage of LLR absolute value equal to or less than threshold TH)−(LRB size)". For example, when the code length is 720 bits, the LRB size is 32-bit, and the percentage of the absolute value of the LLR equal to or less than the threshold TH is 10% as illustrated in FIG. 6, the parameter determination unit 111 determines 720×0.1−32=40 bits as the size of the flip region.

As such, the parameter determination unit 111 determines the flip region so that the size of the flip region increases as the percentage of the LLR absolute value equal to or less than the threshold TH increases. The determination method illustrated in FIG. 6 is an example, and is not limited thereto. Any method may be applied as long as the flip region is determined using the LLR value so that the flip may be executed only in the region with lower reliability. For example, the parameter determination unit 111 may determine the flip region so that the size of the flip region increases as variations in the absolute value of the LLR increases.

The parameter determination unit 111 calculates a standard deviation by, for example, $\sqrt{(n \times R_{Low} \times (1-R_{Low}))}$ (n is a length of data to be decoded, and $R_{Low}$ is a percentage of the absolute value of LLR that is equal to or less than the threshold TH) and calculates a value obtained by multiplying the calculated standard deviation by a predetermined scale value as a correction value. The parameter determination unit 111 corrects the size calculated by the calculation expression described above using the correction value. For example, the parameter determination unit 111 calculates the final size of the flip region by adding the correction value to the size calculated by the calculation expression described above.

Figure 7:
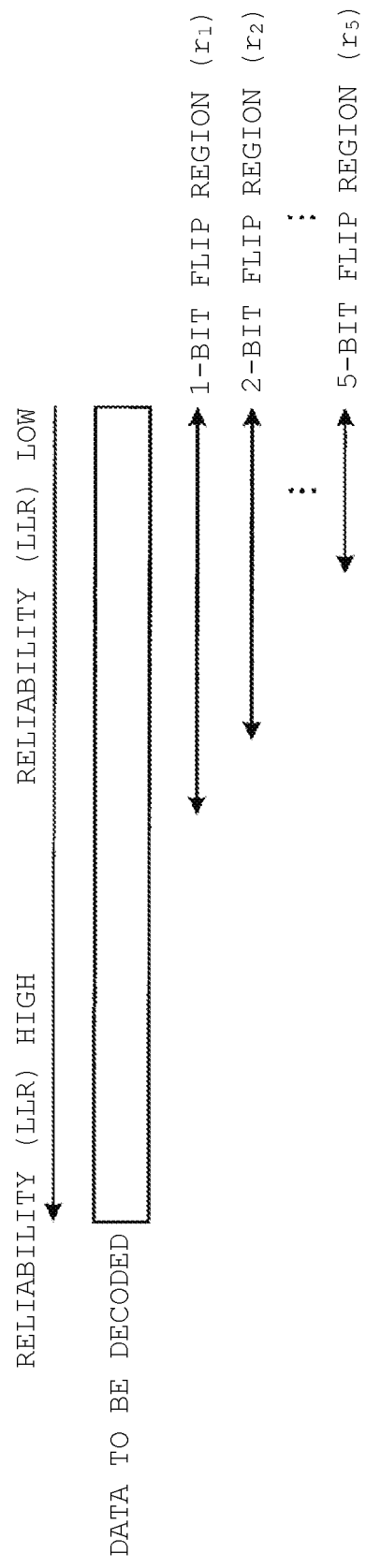
FIG. 7 is a diagram illustrating an example of a flip region used in Chase decoding.

An example using Chase decoding will be described. FIG. 7 is a diagram illustrating an example of a flip region used in the Chase decoding. In the Chase decoding, a test pattern generation process, a decoding process using the generated test pattern, and the like are executed.

The test pattern is a pattern that assumes a combination of the position and number (number of flips) of error bits (bits to be flipped). For example, five test patterns are generated with the flip number j being 1, 2, 3, 4 and 5, respectively. The number of flips is not limited to five. Five test patterns are generated according to the corresponding flip regions $r_1$ to $r_5$. As illustrated in FIG. 7, in the case of Chase decoding, the flip regions $r_1$ to $r_5$ are determined as regions including a plurality of LLR values arranged in descending order of the reliability in the entire decoding target data.

The test pattern having j as the number of flips is generated by selecting any j bits from the bits included in the flip region $r_1$. Test patterns for flip regions $r_j$ (j=1 to 5) are generated by the number of combinations for selecting j bits. That is, the number of test patterns in the flip region $r_j$ may be represented by $r_jC_j$. The rj represents the size (number of bits) of the flip region $r_j$.

When using Chase decoding, the parameter determination unit 111 determines the size of each flip regions $r_j$ using the input LLR value. As a method for determining the size of each flip region $r_j$, the same method as in the case of using the OSD may be applied. The parameter determination unit 111 calculates the size of the corresponding flip region $r_j$ using a different threshold THj depending on the number of flips j. For example, the parameter determination unit 111 may be configured to use the threshold THj that decreases as the number of flips j increases.

In the case of Chase decoding, since there exists no area corresponding to the LRB 512 in FIG. 5, the process of subtracting the size of the LRB is unnecessary. That is, the parameter determination unit 111 calculates the size of the flip region by, for example, "code length×(percentage of LLR absolute value equal to or less than threshold THj)".

Figure 8:
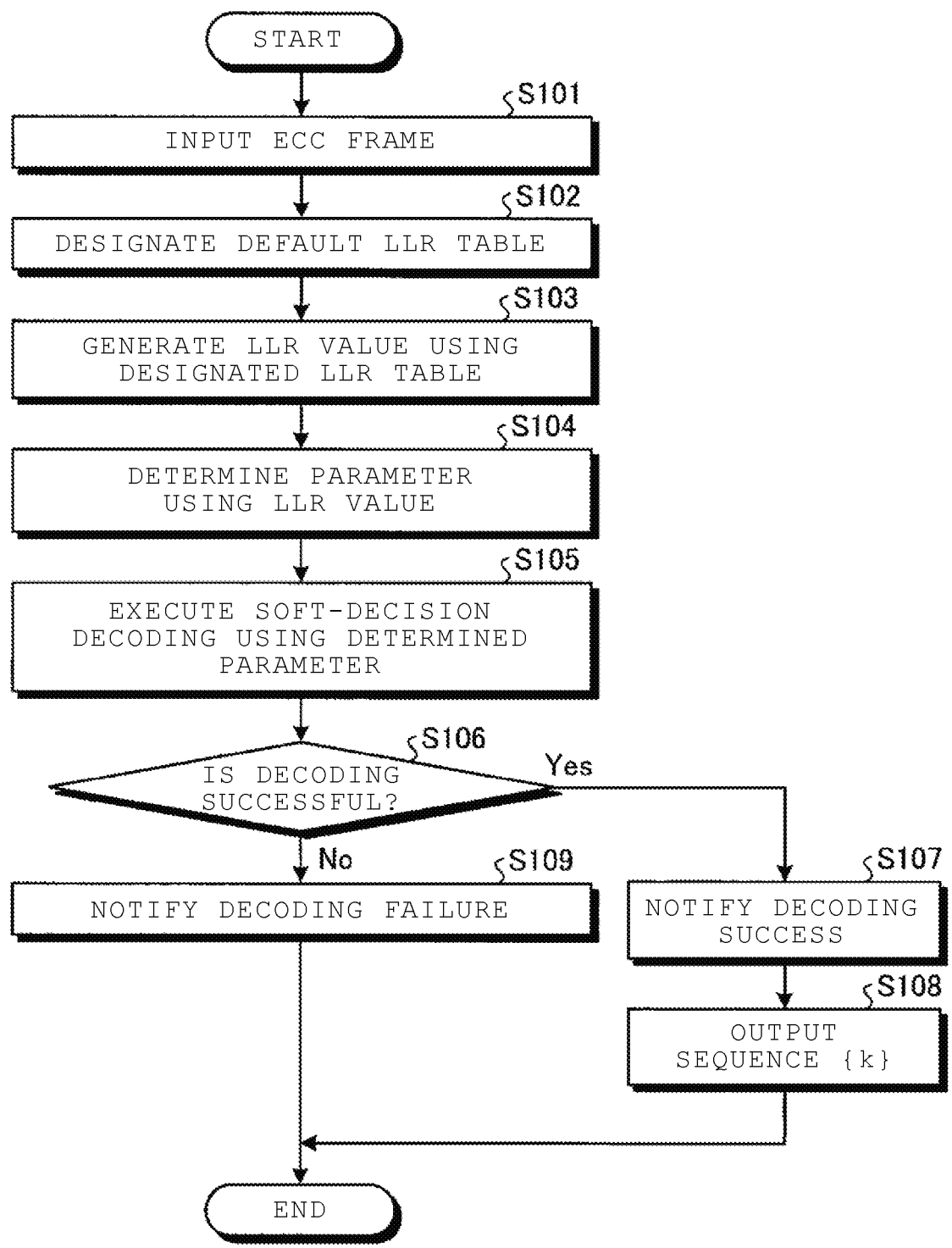
FIG. 8 is a flowchart illustrating an example of a decoding operation according to the first embodiment.

Next, the decoding operation according to this embodiment will be described in detail with reference to the drawings. FIG. 8 is a flowchart illustrating an example of the decoding operation according to this embodiment. As illustrated in FIG. 8, first, the memory I/F 13 inputs the sequence {y} of received values y in units of ECC frames read from the nonvolatile memory 20 to the soft-decision decoder 182 (step S101). The sequence {y} input to soft-decision decoder 182 is input to the LLR conversion unit 101.

The decoding control unit 103 inputs an instruction that the LLR table to be used is a default LLR table to the LLR conversion unit 101 (step S102). The LLR conversion unit 101 converts the sequence {y} of received values y into a sequence of LLR values using a designated default LLR table, and inputs the sequence of LLR values obtained by the conversion into the parameter determination unit 111 and the decoding device 102 (step S103). The parameter determination unit 111 determines decoding parameters, for example, a flip region using the input sequence of LLR values (step S104). Here, the parameter determination unit may determine a set of decoding parameters.

The decoding device 102 decodes the input sequence of LLR values using the determined parameter and outputs a sequence {k} of estimated value k obtained as the decoding result and information such as success or failure of decoding to the decoding control unit 103 (step S105). Here, if a set of decoding parameters are determined in the previous step, the decoding device may decode the input sequence of LLR values several times using the set of decoding parameters.

Next, for example, the decoding control unit 103 determines whether or not the decoding is successful, based on the information input from the decoding device 102 (step S106). When it is determined that the decoding is successful (YES in step S106), for example, the decoding control unit 103 notifies the control unit 11 (see FIG. 1) of decoding success (step S107). The decoding control unit 103 outputs the sequence {k} of estimated values k obtained by decoding (step S108). Thereafter, this operation ends. The output sequence {k} is accumulated in, for example, the data buffer 12 (see FIG. 1), restored to user data that is a write value, and then transmitted to the host 30 that issued the read request.

On the other hand, when it is determined that the decoding fails (NO in step S106), for example, the decoding control unit 103 notifies the control unit 11 (see FIG. 1) of decoding failure (step S109). Thereafter, this operation ends. For example, the control unit 11 transmits a read error of the requested data to the host 30 that issued the read request.

As described above, in this embodiment, the parameters of the decoding process are adaptively (dynamically) determined based on the LLR value obtained by converting the received value read from the nonvolatile memory. With this configuration, it is possible to execute a decoding process that prevents an increase in the amount of calculation without reducing the correction capability, depending on the communication path (stress situation).

Second Embodiment

A memory system according to a second embodiment will be described in detail with reference to the drawings. In the following description, the same configurations and operations as those of the first embodiment are referred to, and redundant description thereof is omitted.

In the first embodiment, LLR values are converted using the default LLR table. In contrast, in the second embodiment, even when decoding fails, an estimated LLR table is created using the sequence of estimated values k obtained by the failed decoding, and the decoding process is executed again using the estimated LLR table.

The memory system according to this embodiment may have the same configuration as the memory system 1 described with reference to FIG. 1 in the first embodiment. However, in this embodiment, the soft-decision decoder 182 in FIG. 4 is replaced with a soft-decision decoder 182-2 illustrated in FIG. 9.

Here, the relationship between "estimation of communication path necessary for soft-decision decoding" and "LLR table" will be described. In the following description, for simplicity, the values that the transmission value x can take are 0 and 1, and the values that the received value y can take are 0, 1, 2, and 3.

In soft-decision decoding, when a communication path to be decoded is determined, the transmission value x written in the nonvolatile memory 20 is stored and the received value y that the transmission value x read from the nonvolatile memory 20 is changed is stored. Therefore, in this description, it is assumed that a histogram as illustrated in Table 1 below is obtained.

TABLE 1

|       | y = 0 | y = 1 | y = 2 | y = 3 |
|-------|-------|-------|-------|-------|
| x = 0 | 1     | 125   | 729   | 2197  |
| x = 1 | 3375  | 1331  | 343   | 27    |

Table 1 illustrates that, as a result of the 8128 observations, the (x=0, y=0) pair was observed once, the (x=1, y=0) pair was observed 3375 times, and the (x=0, y=1) pair was observed 125 times, the (x=1, y=1) pair was observed 1331 times, the (x=0, y=2) pair was observed 729 times, the (x=1, y=2) pair was observed 343 times, the (x=0, y=3) pair was observed 2197 times, and the (x=1, y=3) pair was observed 27 times.

The conditional probability P(x|y) of the true communication path is estimated as follows based on Table 1 described above. That is, if the number of observations (hereinafter also referred to as frequency) for each pair of (x, y) is F(x, y), for example, a conditional probability P(y=0|x=0) at which the (x=0, y=0) pair is observed is obtained as in the following expression (1), and the conditional probability P at which the (x=1, y=0) pair is observed is obtained as in the following expression (2).

[Expression 1]

$$P(y=0 \mid x=0) = \frac{F(x=0, y=0)}{\sum_{y'} F(x=0, y')} = \frac{1}{3052} \quad (1)$$

[Expression 2]

$$P(y=0 \mid x=1) = \frac{F(x=1, y=0)}{\sum_{y'} F(x=1, y')} = \frac{3375}{5076} \quad (2)$$

Therefore, for the assumed communication path, for example, when the received value y is 0, the LLR table is created so that the LLR value obtained from the following expression (3) is assigned. The LLR value in the expression (3) is rounded off to the second decimal place.

[Expression 3]

$$LLR(y=0) = \ln \frac{P(y=0 \mid x=0)}{P(v=0 \mid x=1)} = -7.6 \quad (3)$$

Similarly, the LLR table is created so that the LLRs obtained from the following expressions (4) to (6) are assigned even when the other received values y are 1 to 3, respectively. The LLR values in the expressions (4) to (6) are rounded off to the second decimal place.

[Expression 4]

$$LLR(y=1) = \ln \frac{P(y=1 \mid x=0)}{P(y=1 \mid x=1)} = -1.9 \quad (4)$$

[Expression 5]

$$LLR(y=2) = \ln \frac{P(y=2 \mid x=0)}{P(y=2 \mid x=1)} = 1.3 \quad (5)$$

[Expression 6]

$$LLR(y=3) = \ln \frac{P(y=3 \mid x=0)}{P(y=3 \mid x=1)} = 4.9 \quad (6)$$

The LLR table created as described above can be sufficiently close to the LLR table created from the true communication path matrix by collecting a sufficient number of (x, y) pairs. That is, if a sufficient number of (x, y) pairs can be collected, it is possible to accurately perform the "estimation of the communication path necessary for soft-decision decoding", thereby capable of creating an ideal "LLR table" for the communication path to be decoded.

Next, "communication path estimation" will be described. For example, when the number of communication paths to be decoded is very large, there are cases where LLR tables cannot be prepared in advance for all different communication paths. In such a case, if the decoding is successful, the estimated transmission value k (hereinafter referred to as an estimated value) matches the transmission value x. Therefore, LLR table creation is executed using the estimated value k instead of the transmission value x, and the created LLR table is used for an ECC frame for which decoding fails on the same communication path. With this configuration, even when the LLR table cannot be prepared in advance, it is possible to prevent degradation of the decoding characteristics.

However, even when decoding fails, if the number of error bits is reduced to some extent by this decoding, the LLR table creation described above is executed using the sequence {k} of estimated values k, and decoding may be successful by using the LLR table (hereinafter referred to as the estimated LLR table) newly obtained by the execution of LLR table creation.

In this way, in the decoding in the memory system, if the communication path assumed in advance and the actual communication path are different, the probability of failure in decoding increases, but the estimated communication path may be able to be brought close to the correct communication path based on the failed decoding result.

In this embodiment, even when decoding fails, by performing the procedure of estimating the communication path from the result of the failure, in other words, the procedure of creating the LLR table at least once, it becomes possible to rescue the decoding failure based on the mismatch of the communication path.

Figure 9:
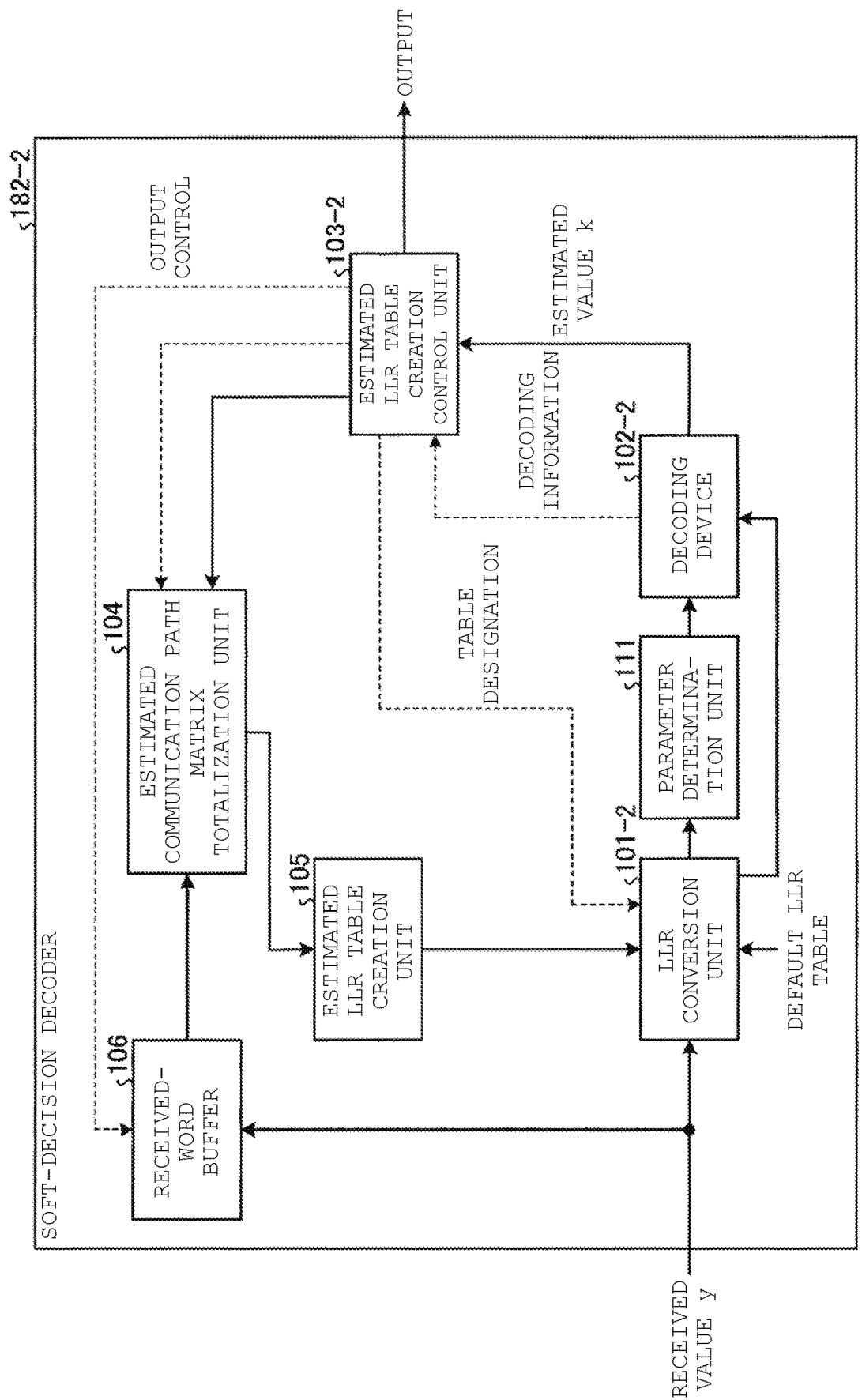
FIG. 9 is a block diagram illustrating an example of a more detailed configuration of a soft-decision decoding unit according to a second embodiment.

FIG. 9 is a block diagram illustrating an example of a more detailed configuration of the soft-decision decoding unit according to this embodiment. As illustrated in FIG. 9, the soft-decision decoder 182-2 includes an LLR conversion unit 101-2, the parameter determination unit 111, a decoding device 102-2, an estimated LLR table creation control unit 103-2, an estimated communication path matrix totalization unit 104, an estimated LLR table creation unit 105, and a received-word buffer 106.

In this configuration, the received-word buffer 106 stores a sequence {y} of received values y in units of ECC frames. Specifically, the received-word buffer 106 receives and stores the sequence {y} of received values y read from the nonvolatile memory 20 in units of ECC frames. The received-word buffer 106 receives, from the estimated LLR table creation control unit 103-2 described later, an instruction to start output, information which ECC frame the sequence {y} of received values y related to is output, or information designating whether or not to output a specific received value y in the ECC frame. Then, according to the instruction to start output, the received-word buffer 106 outputs the designated sequence {y} or the designated received value y among the currently stored received values y in ECC frames to the estimated communication path matrix totalization unit 104.

The estimated LLR table creation control unit 103-2 sequentially creates an estimated communication path matrix from a specific (k, y) pair. Specifically, the sequence {k} of estimated values k in units of ECC frames as a decoding result from the decoding device 102-2 is input to the estimated LLR table creation control unit 103-2. Information obtained after decoding, such as information indication whether decoding succeeds or fails, is also input to the estimated LLR table creation control unit 103-2. Then, the estimated LLR table creation control unit 103-2 determines whether the input sequence {k} of the estimated values k is to be output to the outside or the estimated communication path matrix totalization unit 104 and outputs the sequence {k} of the estimated values k to the determined destination. The estimated LLR table creation control unit 103-2 outputs a signal for instructing the received-word buffer 106 to start output and a control signal for controlling the estimated communication path matrix totalization unit 104.

The estimated communication path matrix totalization unit 104 totalizes (k, y) pairs to create and store an estimated communication path matrix. Specifically, the estimated communication path matrix totalization unit 104 receives the sequence {k} of estimated values k in units of ECC frames selected by the estimated LLR table creation control unit 103-2 and a sequence {y} of received values y which is an output from the received-word buffer 106 and belongs to the same ECC frame as the sequence {k} of estimated values k input from the estimated LLR table creation control unit 103-2. Then, the estimated communication path matrix totalization unit 104 totalizes the (k, y) pairs from the input sequences {k} and {y}, and creates an estimated communication path matrix that is a list of the likelihoods P (y|k) or a frequency distribution that is the basis of the likelihoods P, based on the current totalization results obtained by totaling the (k, y) pairs. The estimated communication path matrix totalization unit 104 outputs the created estimated communication path matrix or frequency distribution to the estimated LLR table creation unit 105. The estimated communication path matrix totalization unit 104 also receives a reset signal of the totalization result, a control signal notifying the output timing, and the like from the estimated LLR table creation control unit 103-2.

The estimated LLR table creation unit 105 calculates the estimated LLR table from the frequency distribution or the estimated communication path matrix input from the estimated communication path matrix totalization unit 104. Then, the estimated LLR table creation unit 105 outputs the estimated LLR table obtained by the calculation to the LLR conversion unit 101-2.

The LLR conversion unit 101-2 uses the estimated LLR table or the LLR table designated by the estimated LLR table creation control unit 103-2 to convert the received value y received by being read from the nonvolatile memory 20 to an LLR value. In addition to the default LLR table, the LLR table from the estimated LLR table creation unit 105 used for conversion between the received value y and the LLR value is input to the LLR conversion unit 101-2. Then, the LLR conversion unit 101-2 outputs the sequence of LLR values obtained by converting the received value y using the LLR table designated by the estimated LLR table creation controller 103-2 to the parameter determination unit 111 and the decoding device 102-2.

The decoding device 102-2 is different from the decoding device 102 of the first embodiment in that the sequence {k} of estimated value k obtained by decoding and information obtained from decoding such as success or failure of decoding are output to the estimated LLR table creation control unit 103-2.

Figure 10:
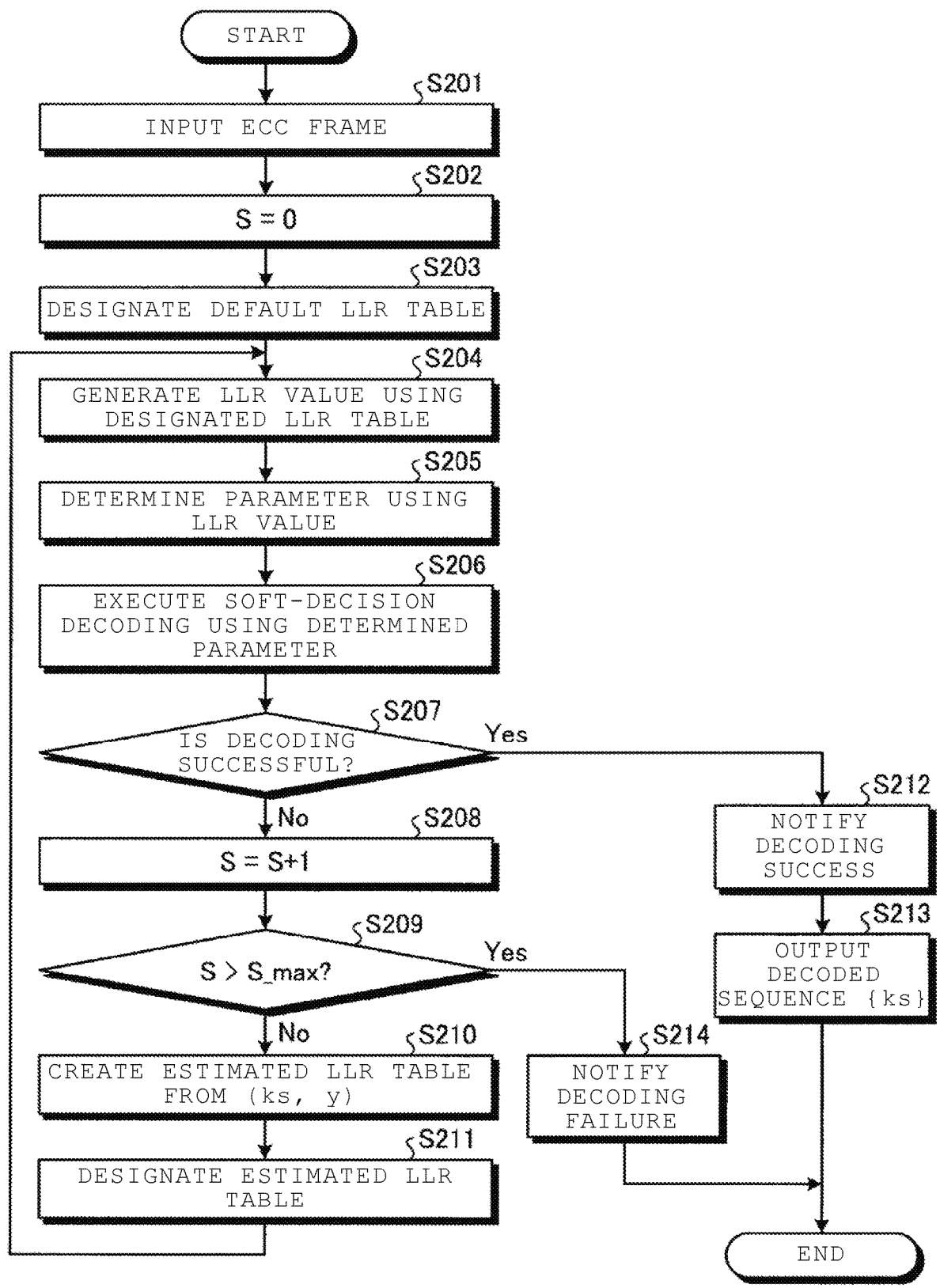
FIG. 10 is a flowchart illustrating an example of a decoding operation according to the second embodiment.

Next, the decoding operation according to this embodiment will be described in detail with reference to the drawings. FIG. 10 is a flowchart illustrating an example of the decoding operation according to this embodiment. As illustrated in FIG. 10, in this operation, first, a sequence {y} of received values y in units of ECC frames read from the nonvolatile memory 20 by the memory I/F 13 is input to the soft-decision decoder 182-2 (step S201). The sequence {y} input to the soft-decision decoder 182-2 is stored in the received-word buffer 106 and input to the LLR conversion unit 101-2.

For example, the estimated LLR table creation control unit 103-2 resets a count value S of a counter (not illustrated) that counts the number of repetitions of creation of the estimated LLR table (S=0) (step S202).

The estimated LLR table creation control unit 103-2 inputs an instruction to the LLR conversion unit 101-2 that the LLR table to be used for the input sequence {y} of received values y is the default LLR table, based on the count value S being 0, for example (step S203). The LLR conversion unit 101-2 converts the sequence {y} of received values y into a sequence of LLR values using the designated LLR table, and inputs the sequence of LLR values obtained by the conversion to the parameter determination unit 111 and the decoding device 102-2 (step S204). The parameter determination unit 111 determines a parameter, that is, a flip region, using the input sequence of LLR values (step S205).

The decoding device 102-2 decodes the input sequence of LLR values using the determined parameter and outputs the sequence {k} of the estimated values k obtained as a result and information such as success or failure of decoding to the estimated LLR table creation control unit 103-2 (step S206). In the following description, the estimated value k obtained at the time of the count value S is defined as $k_s$, and the sequence of the estimated values $k_s$ is defined as a decoded sequence $\{k_s\}$.

For example, the estimated LLR table creation control unit 103-2 determines whether or not the decoding is successful, based on the information input from the decoding device 102-2 (step S207). When it is determined that the decoding is successful (YES in step S207), the operation proceeds to step S212. On the other hand, when it is determined that the decoding fails (NO in step S207), for example, the estimated LLR table creation control unit 103-2 increments the count value S by 1 (step S208).

Subsequently, the estimated LLR table creation control unit 103-2 determines whether or not the count value S is greater than the maximum value S_max of the number of repetitions (step S209). The maximum value S_max is a limit value for avoiding repetitive creation of the estimated LLR table (steps S207 to S211) based on the decoding result that the decoding fails until the decoding is successful. When it is determined that the count value S is greater than the maximum value S_max (YES in step S209), this operation proceeds to step S214. On the other hand, when it is determined that the count value S is equal to or less than the maximum value S_max (NO in step S209), this operation proceeds to step S210.

In step S210, an estimated LLR table is created from the frequency of each ($k_s$, y) pair of estimated values $k_s$ and received value y obtained by decoding in step S206. Specifically, the estimated communication path matrix totalization unit 104 creates ($k_s$, y) pairs from the sequence $\{k_s\}$ of estimated values $k_s$ input via the estimated LLR table creation control unit 103-2 and the sequence {y} of received values y input from the received-word buffer 106, and totalizes the frequency of each pair. Then, the estimated communication path matrix totalization unit 104 creates a frequency distribution or estimated communication path matrix that is a list of likelihoods $P(y|k_s)$ based on the current totalization result, and inputs the created estimated communication path matrix or frequency distribution to the estimated LLR table creation unit 105. The estimated LLR table creation unit 105 creates an estimated LLR table by using, for example, the expressions (3) to (6) described above, based on the input estimated communication path matrix or frequency distribution. The created estimated LLR table is input to the LLR conversion unit 101-2.

The estimated LLR table creation control unit 103-2 designates the created estimated LLR table as the LLR table to be used (step S211). Thereafter, this operation returns to step S204. With this configuration, the sequence {y} of received values y is decoded using the estimated LLR table (steps S204 to S206).

When it is determined that the decoding in step S206 is successful (YES in step S207), the decoding success is notified from, for example, the estimated LLR table creation control unit 103-2 to the control unit 11 (see FIG. 1) (step S212). From the estimated LLR table creation control unit 103-2, a decoded sequence $\{k_s\}$ of the estimated values $k_s$ obtained by decoding is also output (step S213). Thereafter, this operation ends. The output decoded sequence $\{k_s\}$ is accumulated in, for example, the data buffer 12 (see FIG. 1), restored to user data that is a write value, and then transmitted to the host 30 that issued the read request.

When it is determined that the decoding is not successful even if the creation of the estimated LLR table is repeated until the count value S reaches the maximum value S_max (YES in step S209), for example, the decoding failure is notified from the estimated LLR table creation control unit 103-2 to the control unit 11 (see FIG. 1) (step S214), and this operation ends. In response to this, for example, the control unit 11 transmits a read error of the requested data to the host 30 that issued the read request.

In FIG. 10, although a parameter is determined each time the sequence of LLR values is output, for example, a configuration in which a fixed parameter is used until the count value S reaches a prescribed value and a parameter determination process by the parameter determination unit 111 is executed when the count value S is equal to or greater than the prescribed value may be adopted.

As described above, in this embodiment, even when decoding fails, creation of the estimation LLR table is executed one or more times using the sequence {k} of estimated values k obtained by the failed decoding. With this configuration, it is possible to bring the estimated communication path closer to the correct communication path. As a result, the possibility that a decoding failure based on the communication path mismatch can be decreased, and thus it is possible to provide a memory system capable of preventing degradation of the decoding characteristics based on the communication path mismatch.

In this embodiment, similarly to the first embodiment, the parameters of the decoding process are adaptively (dynamically) determined based on the LLR value obtained by converting the received value read from the nonvolatile memory. With this configuration, it is possible to execute a decoding process in which an increase in the amount of calculation is prevented without reducing the correction capability depending on the communication path (stress situation).

Third Embodiment

A memory system according to a third embodiment will be described in detail with reference to the drawings. In the following description, the same configurations and operations as those of the second embodiment are referred to, and redundant description thereof is omitted.

The second embodiment has a configuration in which the estimated communication path is brought close to the correct communication path by repeating the operation of creating the estimated LLR table one or more times based on the failed decoding result. In contrast, the third embodiment includes a configuration for further correcting the estimated LLR table created in the same manner as the second embodiment.

The memory system according to this embodiment may have the same configuration as the memory system 1 described with reference to FIG. 1 in the first embodiment. However, in this embodiment, the soft-decision decoder 182-2 in FIG. 9 is replaced with a soft-decision decoder 182-3 illustrated in FIG. 11.

Figure 11:
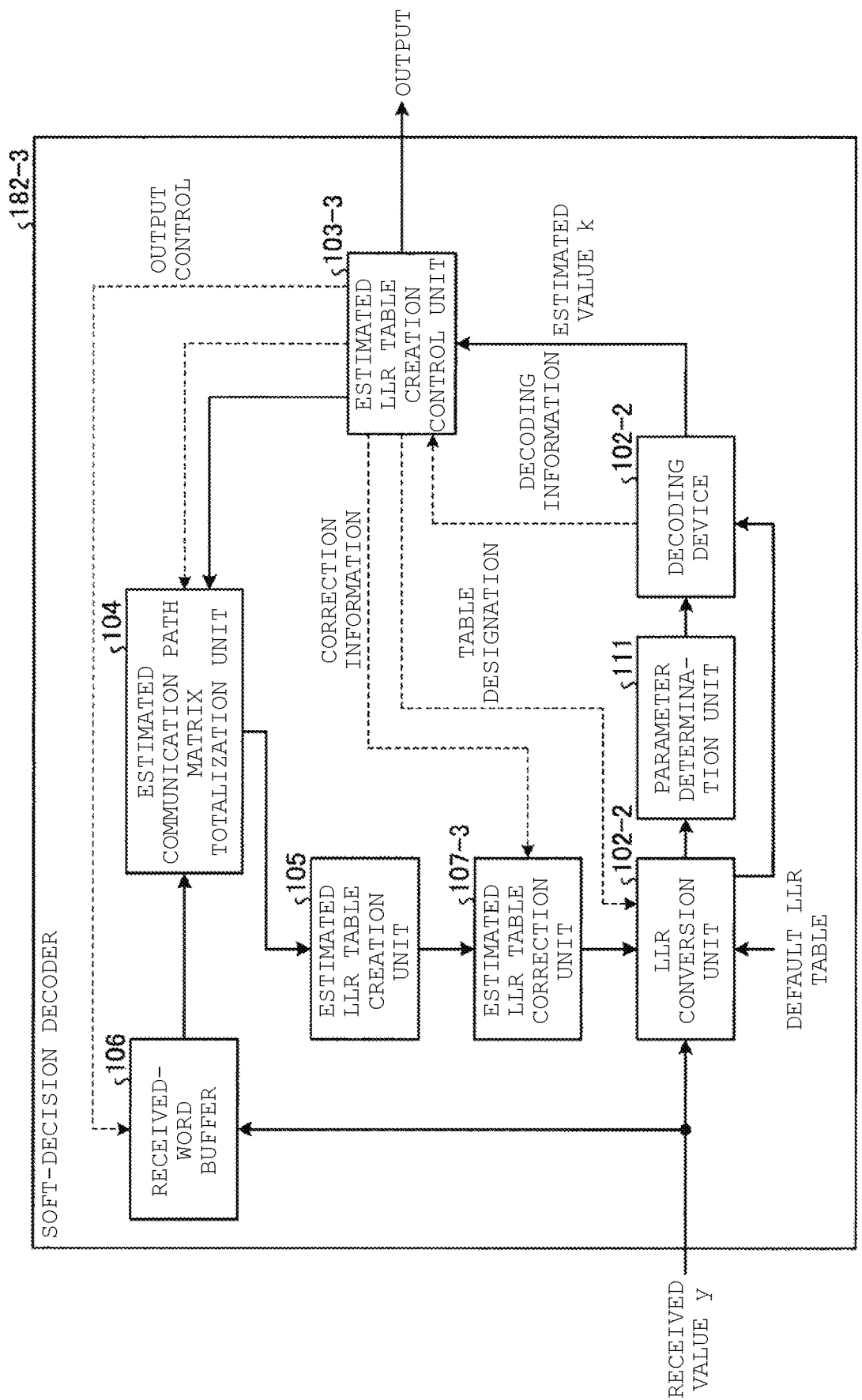
FIG. 11 is a block diagram illustrating an example of a more detailed configuration of a soft-decision decoding unit according to a third embodiment.

As illustrated in FIG. 11, the soft-decision decoder 182-3 according to this embodiment further includes an estimated LLR table correction unit 107-3 in addition to the same configuration as the soft-decision decoder 182-2 illustrated in FIG. 9. The estimated LLR table correction unit 107-3 corrects the estimated LLR table created by the estimated LLR table creation unit 105, for example, according to an instruction from the estimated LLR table creation control unit 103-3, and inputs the estimated LLR table after correction to the LLR conversion unit 102-2.

Figure 12:
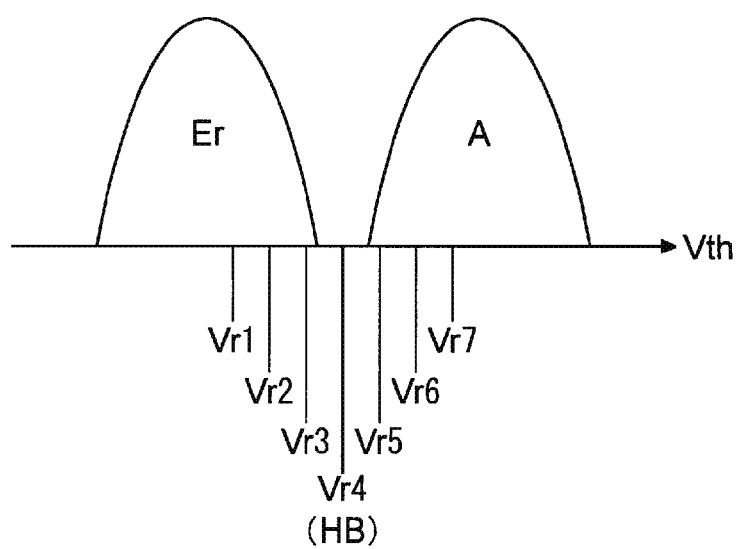
FIG. 12 is a schematic diagram illustrating a relationship between a threshold voltage distribution and a read voltage.

Here, an example of correction executed by the estimated LLR table correction unit 107-3 will be described. FIG. 12 is a schematic diagram illustrating the relationship between a threshold voltage distribution and a read voltage when each memory cell constituting the nonvolatile memory 20 is a single level cell (SLC) storing 1-bit data. In FIG. 12, the Er distribution indicates, for example, the threshold voltage distribution of a memory cell in which data of "1" is written, and the A distribution indicates the threshold voltage distribution of, for example, a memory cell in which data of "0" is written. Vr1 to Vr7 illustrate examples of read voltages (hereinafter referred to as read levels) used when reading data from the memory cells. Among Vr1 to Vr7, Vr4 indicates an example of a read level used in hard-decision reading (hard bit read), and Vr1 to Vr3 and Vr5 to Vr7 indicate examples of read levels used in soft-decision reading (soft bit read). However, the read level used in the soft bit read may include Vr4.

For such a threshold voltage distribution, when the threshold voltage of a memory cell is, for example, a voltage near the peak of the Er distribution, the value of data stored in the memory cell is likely to be '1'. Similarly, when the threshold voltage of a memory cell is, for example, a voltage near the peak of the A distribution, the value of data stored in the memory cell is likely to be '0'. Therefore, in an example of the correction executed by the estimated LLR table correction unit 107-3 in such a case, the correction is performed in such a way that, when it is recognized from the read data that the threshold voltage of the memory cell is near the peak of any distribution, the absolute value of the LLR value is set to a high value assuming that the probability of a value corresponding to the distribution is high.

When the threshold voltage of the memory cell is, for example, a voltage near the boundary between the Er distribution and the A distribution, the possibility that the value of data stored in the memory cell is '1' and the possibility that the value of data is '0' are almost the same. Therefore, in an example of the correction performed by the estimated LLR table correction unit 107-3 in such a case, the correction is performed in such a way that, when it is recognized from the read data that the threshold voltage of the memory cell is near the boundary between adjacent distributions, the absolute value of the LLR value is corrected to be a low value assuming that it is uncertain which value corresponds to which distribution. In that case, the sign of the LLR value may be reversed.

As a correction method, various methods such as a method of making the absolute value of the LLR value a fixed value, a method of adding or subtracting a predetermined value to and from the absolute value of the LLR value, and the like may be applied.

Figure 13:
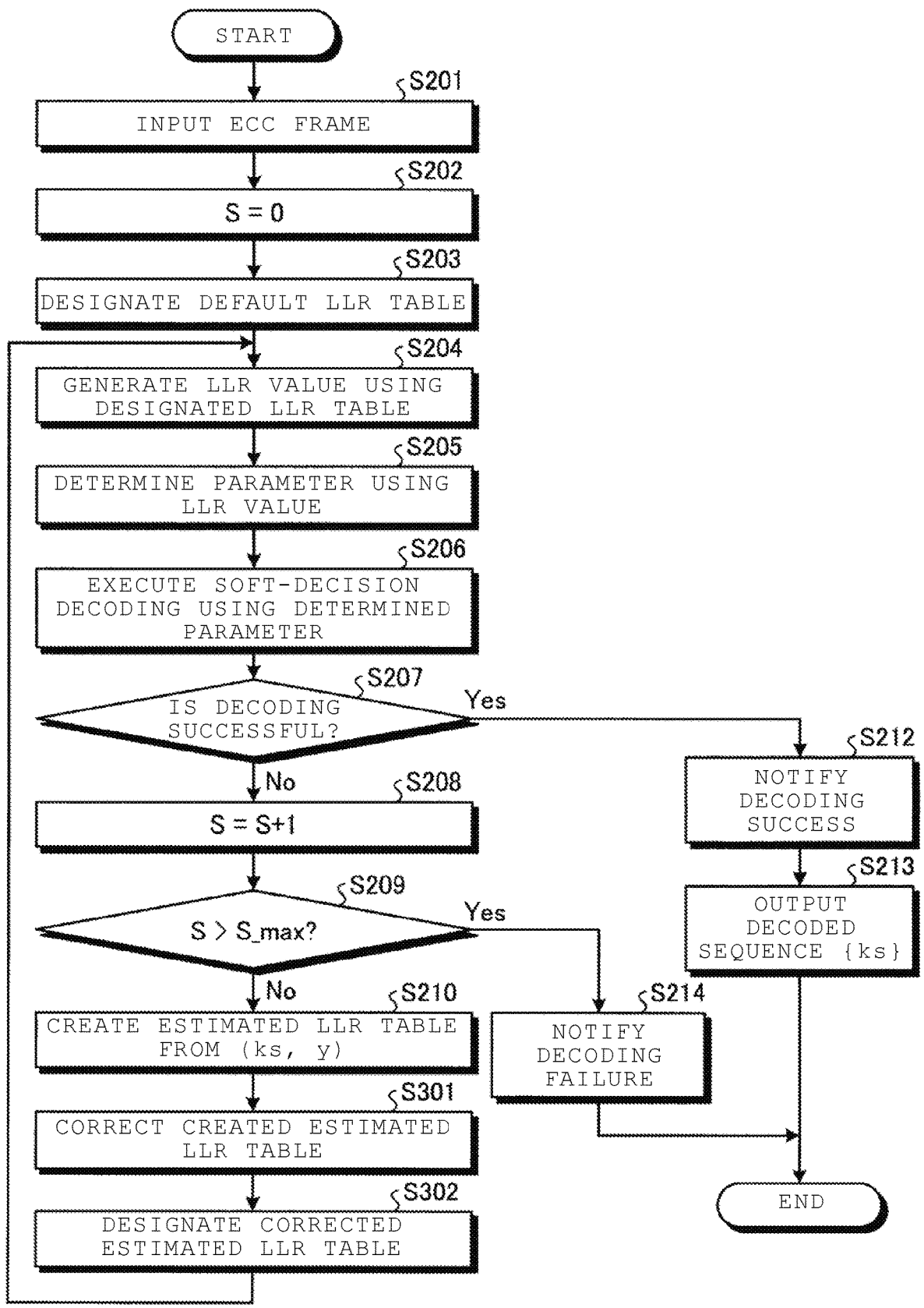
FIG. 13 is a flowchart illustrating an example of a decoding operation according to the third embodiment.

The decoding operation according to this embodiment will be described in detail with reference to the drawings. FIG. 13 is a flowchart illustrating an example of the decoding operation according to this embodiment. As illustrated in FIG. 13, in the decoding operation according to this embodiment, step S211 is replaced with steps S301 to S302 in the same operation as the decoding operation according to the second embodiment illustrated in FIG. 10.

That is, in this embodiment, when an estimated LLR table is created from the frequency of each ($k_s$, y) pair of the estimated value $k_s$ and the received value y obtained by the decoding in step S206 (step S210), the created estimated LLR table is corrected (step S301). Specifically, when the estimated LLR table created by the estimated LLR table creation unit 105 is input to the estimated LLR table correction unit 107-3, the estimated LLR table correction unit 107-3 corrects the estimated LLR table based on the correction information input from the estimated LLR table creation control unit 103-2, and inputs the corrected estimated LLR table to the LLR conversion unit 101-2.

The estimated LLR table creation control unit 103-2 designates the corrected estimated LLR table as the LLR table to be used (step S302). Thereafter, this operation returns to step S204. With this configuration, the sequence {y} of received values y is decoded using the corrected estimated LLR table (steps S204 to S206).

As described above, this embodiment has a configuration for correcting the estimated LLR table created based on the failed decoding result. With this configuration, in this embodiment, if the correction is appropriate for the stress, the estimated LLR table can be corrected so that the decoding succeeds more stably.

Other configurations, operations, and effects are the same as in the embodiments described above, and thus detailed description thereof is omitted here.

Fourth Embodiment

A memory system according to a fourth embodiment will be described in detail with reference to the drawings. In the following description, the same configurations and operations as those of the second or third embodiment are referred to, and redundant description thereof is omitted.

In the second or third embodiment described above, the case where the estimated LLR table is created based on the decoding result of one ECC frame is exemplified. In contrast, in the fourth embodiment, a case where an estimated LLR table is created based on the decoding results of a plurality of ECC frames is exemplified.

If the communication paths are assumed to be affected by the same noise, the conditional probability P(y|x) obtained from these communication paths is the same. Therefore, in this embodiment, when a plurality of ECC frames that are considered to be affected by noise on the same communication path can be collectively processed, an estimated LLR table is created from the totalization result of the entire ECC frames. With this configuration, it is possible to increase the number of (k, y) pairs used to create the estimated LLR table, and thus the estimated communication path can be brought closer to the true communication path. As a communication path assumed to be affected by the same noise, an ECC frame written on the same or adjacent word line is assumed, but is not limited thereto.

The configuration of the memory system and the decoding unit thereof according to this embodiment may be the same as, for example, the memory system 1 and the soft-decision decoder 182-2 or 182-3 according to the second or third embodiment described above. However, in this embodiment, the soft-decision decoder 182-2 or 182-3 is configured to be able to collectively process a plurality of ECC frames, and the plurality of ECC frames are input to the decoding device 102, and the plurality of ECC frames are stored in the received-word buffer 106.

Next, the decoding operation according to this embodiment will be described in detail with reference to the drawings. The following description is based on the decoding operation (see FIG. 13) exemplified in the third embodiment, but is not limited thereto, and various modifications may be made, for example, based on the decoding operation (see FIG. 10) exemplified in the second embodiment.

Figure 14:
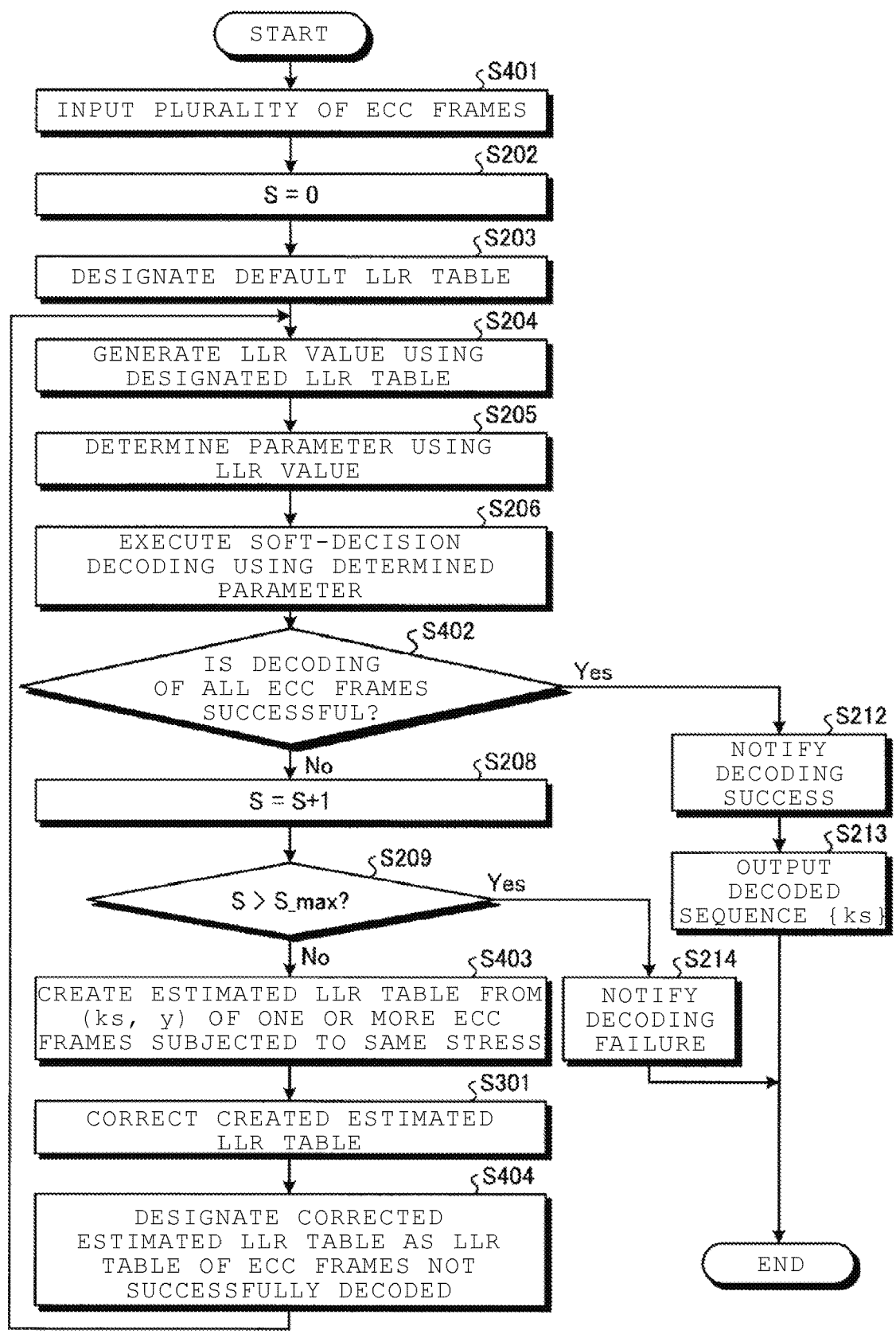
FIG. 14 is a flowchart illustrating an example of a decoding operation according to a fourth embodiment.

FIG. 14 is a flowchart illustrating an example of the decoding operation according to this embodiment. As illustrated in FIG. 14, in the decoding operation according to this embodiment, steps S201, S207, S210 and S302 are respectively replaced with steps S401, S402, S403 and S404 in the same operation as the decoding operation according to the third embodiment shown in FIG. 13.

That is, in this embodiment, first, a sequence $\{y\}$ of a plurality of ECC frames read from the nonvolatile memory 20 by the memory I/F 13 is input to the soft-decision decoder 182-3 (step S401). The sequence $\{y\}$ of the plurality of ECC frames input to the soft-decision decoder 182-3 is stored in the received-word buffer 106 and input to the LLR conversion unit 101-2.

After the count value S is reset (S=0) (step S202), the input sequence $\{y\}$ of the plurality of ECC frames is decoded using the designated LLR table (steps S203 to 206). Decoding for an individual sequence $\{y\}$ of ECC frames may be the same as in the embodiments described above.

Next, for example, the estimated LLR table creation control unit 103-2 determines whether or not decoding of all ECC frames is successful, based on information input from the decoding device 102-2 (step S402). When it is determined that the decoding of all ECC frames is successful (YES in step S402), this operation proceeds to step S212, and the operation of step S212 and the subsequent operations are executed. On the other hand, when it is determined that there exists an ECC frame for which decoding fails (NO in step S402), the count value S is incremented by 1 (step S208), and it is determined whether or not the incremented count value S is greater than the maximum value S_max (step S209). Thereafter, when it is determined the count value S is greater than the maximum value S_max (YES in step S209), the operation proceeds to step S214, and the operation of step S214 and subsequent operations are executed. On the other hand, when it is determined that the count value S is equal to or less than the maximum value S_max (NO in step S209), this operation proceeds to step S403.

In step S403, an estimated LLR table is created from the frequency of each $(k_s, y)$ pair of the sequence $\{k_s\}$ of the estimated values $k_s$ of one or more ECC frames subjected to the same stress and the received value y, among the sequences $\{k_s\}$ of estimated values $k_s$ obtained by decoding in step S206. Specifically, the estimated communication path matrix totalization unit 104 specifies one or more ECC frames that are assumed to be subjected to the same stress, among a plurality of ECC frames input via the estimated LLR table creation control unit 103-2. Subsequently, the estimated communication path matrix totalization unit 104 creates a $(k_s, y)$ pair from the sequence $\{k_s\}$ of estimated values $k_s$ of each of the one or more specified ECC frames and the sequence $\{y\}$ of received values y input from the received-word buffer 106, and the frequency of each created set is totalized. Then, the estimated communication path matrix totalization unit 104 creates a frequency distribution or estimated communication path matrix that is a list of likelihoods $P(y|k_s)$ based on the current totalization result, and inputs the created estimated communication path matrix or frequency distribution to the estimated LLR table creation unit 105. The estimated LLR table creation unit 105 creates an estimated LLR table by using, for example, the expressions (3) to (6) described above, based on the input estimated communication path matrix or frequency distribution. The created estimated LLR table is input to the estimated LLR table correction unit 107-3 and corrected (step S301).

The estimated LLR table creation control unit 103-2 designates the corrected estimated LLR table as the LLR table to be used for the sequence $\{y\}$ of received values y of ECC frames that are not yet successfully decoded among all the ECC frames (step S404). Thereafter, the operation returns to step S204. With this configuration, the sequence $\{y\}$ of the received values y of the ECC frame for which decoding is not successful is decoded using the corrected estimated LLR table (steps S204 to S206). The decoding of the sequence $\{y\}$ of individual ECC frames may be the same as in the embodiments described above.

As described above, in this embodiment, when a plurality of ECC frames that are considered to be affected by noise on the same communication path can be collectively processed, the estimated LLR table is created from the totalization result of all the ECC frames. With this configuration, it is possible to increase the number of (k, y) pairs used to create the estimated LLR table, and thus the estimated communication path can be brought closer to the true communication path.

Since other configurations, operations, and effects are the same as those of embodiments the described above, detailed description thereof is omitted here.

Fifth Embodiment

A memory system according to the fifth embodiment will be described in detail with reference to the accompanying drawings. In the following description, the same configurations and operations as those in any of the second to fourth embodiments are referred to, and redundant description thereof is omitted.

The second embodiment has a configuration in which the estimated communication path is brought closer to the correct communication path by repeating the operation of creating the estimated LLR table one or more times based on the failed decoding result. In contrast, the fifth embodiment has a configuration in which posterior probability information may be used to create an estimated LLR table.

The memory system according to this embodiment may have the same configuration as the memory system 1 described with reference to FIG. 1 in the first embodiment. However, in this embodiment, the soft-decision decoder 182-2 in FIG. 1 is replaced with a soft-decision decoder 182-5 illustrated in FIG. 15.

Figure 15:
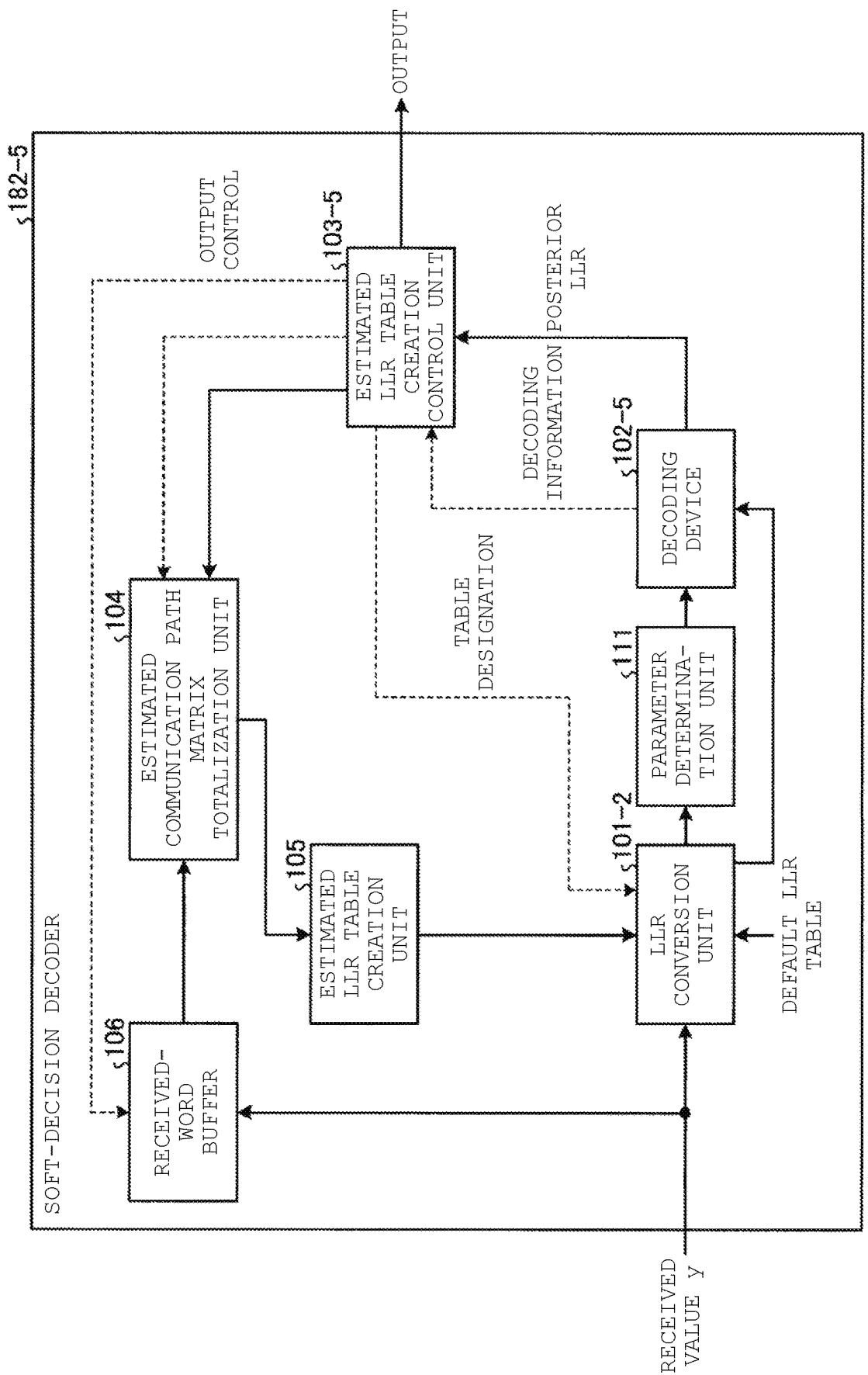
FIG. 15 is a block diagram illustrating an example of a more detailed configuration of a soft-decision decoding unit according to a fifth embodiment.

As illustrated in FIG. 15, the soft-decision decoder 182-5 according to this embodiment has the same configuration as the soft-decision decoder 182-2 illustrated in FIG. 9, and in the soft-decision decoder 182-5, the decoding device 102-2 that outputs the estimated value in FIG. 9 is replaced with a decoding device 102-5 that outputs the posterior LLR illustrated in FIG. 15. The posterior LLR is information on which the estimated value is based, is a log likelihood ratio relating to the posterior probability information, and is an output of the soft-decision decoding unit in which estimation by code information is also added, in addition to the sequence {y} of received values. In the normal case where the estimated value k is obtained from the posterior LLR and the probability that the stored bit is '0' and the stored bit is '1' are the same, the sign of the value corresponds to bits '0' and '1', and the absolute value is related to the reliability of write value estimation by the decoder.

The output of the decoding device 102-5 may be an external value instead of the posterior LLR. The external value is obtained by subtracting the LLR at the time of input from the posterior LLR. The fifth embodiment may be implemented even when the external value is used instead of the posterior LLR.

In this embodiment, the estimated LLR table creation control unit 103-2 using the sequence {k} of estimated values in FIG. 9 is replaced with the estimated LLR table creation control unit 103-5 that uses a sequence {l} of posterior LLRs in FIG. 15.

Figure 16:
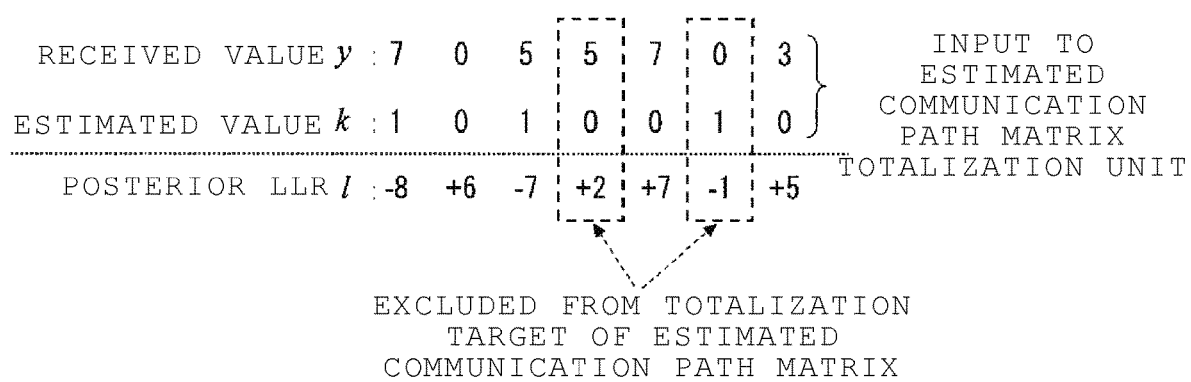
FIG. 16 is a diagram illustrating a specific usage example of posterior LLRs in an estimated LLR table creation control unit in the fifth embodiment.

A specific usage example of the posterior LLR in the estimated LLR table creation control unit 103-5 will be described with reference to FIG. 16. In FIG. 16, an example of the sequence {y} of received values, the sequence {l} of posterior LLRs, and the sequence {k} of estimated values obtained from the sequence {l} of posterior LLRs is illustrated. In FIG. 16, received values, estimated values, and posterior LLRs arranged vertically are information on the same bit. When attention is focused on the rightmost bit, the posterior LLR paired with the received value 3 is +5. Since this value is positive, bit '0' is an estimated value for the rightmost bit. At this time, since the absolute value of the posterior LLR is not a small value of 5, a (k=0, y=3) pair is used in the estimated communication path matrix totalization unit 104. On the other hand, for the second bit from the right, the absolute value of the posterior LLR is a small value of 1. For that reason, the estimated communication path matrix totalization unit 104 does not use (k=1, y=0) related to the second bit. In FIG. 16, although the case where the pair of the estimated value and the received value corresponding to the posterior LLR having an absolute value of 2 or less is not used in the estimated communication path matrix totalization unit 104 is illustrated, the threshold for the absolute value of the posterior LLR used when determining use/non-use is not limited to 2, and may be variously changed.

Figure 17:
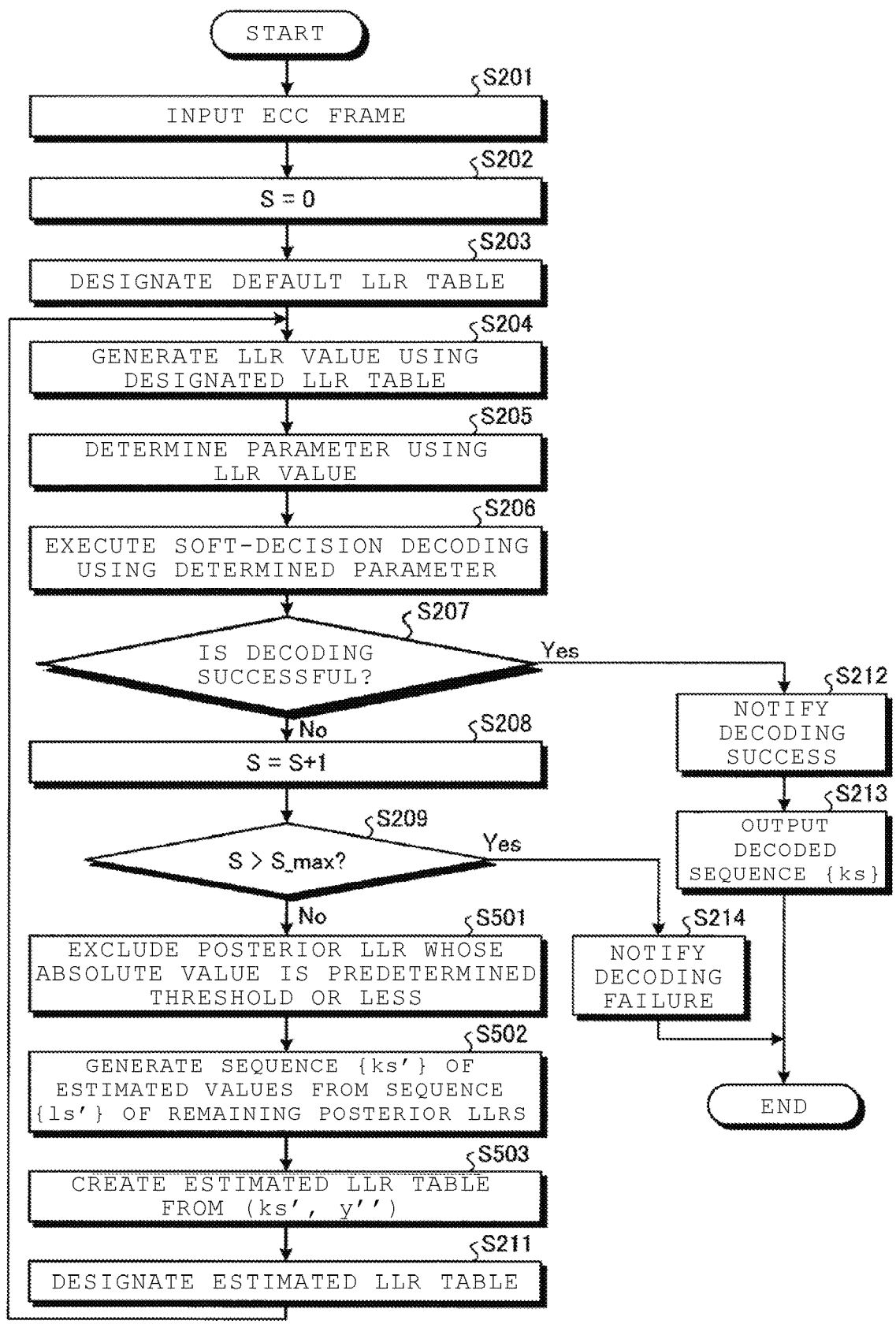
FIG. 17 is a flowchart illustrating an example of a decoding operation according to the fifth embodiment.

Next, the decoding operation according to this embodiment will be described in detail with reference to the drawings. FIG. 17 is a flowchart illustrating an example of the decoding operation according to this embodiment. As illustrated in FIG. 17, in the decoding operation according to this embodiment, step S210 is replaced with steps S501 to S503 in the same operation as the decoding operation according to the second embodiment illustrated in FIG. 10. In step S206 of FIG. 17, a sequence {$l_s$} of posterior LLRs is output as a decoding result instead of the sequence {$k_s$} of estimated values.

When it is determined that the decoding in step S206 fails (NO in step S207) and the count value S indicating the number of repetitions is equal to or less than the maximum value S_max (NO in step S209), the estimated LLR table creation control unit 103-5 excludes the posterior LLR whose absolute value is less than or equal to a predetermined threshold (2 in the example illustrated in FIG. 16) from the sequence {$l_s$} of posterior LLRs obtained by the decoding in step S206 (Step S501). Subsequently, the estimated LLR table creation control unit 103-5 generates a sequence {$k_s'$} of estimated values for the remaining sequence {$l_s'$} of posterior LLRs (step S502).

The generated sequence {$k_s'$} of estimated values is input to the estimated communication path matrix totalization unit 104. The estimated communication path matrix totalization unit 104 also receives a sequence {y″} of received values corresponding to the posterior LLR whose absolute value is greater than the predetermined threshold. Accordingly, in step S403, the estimated communication path matrix totalization unit 104 creates a ($k_s'$, y″) pair of the sequence {$k_s'$} of estimated values input from the estimated LLR table creation control unit 103-2 and the sequence {y″} of received values input from the received-word buffer 106, totalizes the frequency of each pair, creates an estimated communication path matrix or frequency distribution based on the totalization result, and inputs the created estimated communication path matrix or frequency distribution to the estimated LLR table creation unit 105. In response to this, the estimated LLR table creation unit 105 creates an estimated LLR table by using, for example, the expressions (3) to (6) described above based on the input estimated communication path matrix or frequency distribution. The created estimated LLR table is input to the LLR conversion unit 101-2.

As described above, according to this embodiment, even when the posterior probability information is used to create the estimated LLR table, the same effects as those of the second to fourth embodiments described above can be obtained. In this embodiment, it is possible to improve error correction capability by limiting the (k, y) pair totalized by the estimated communication path matrix totalization unit 104 based on the absolute value of the posterior LLR.

Since other configurations, operations, and effects are the same as those of the embodiments described above, detailed description thereof is omitted here. In this embodiment, the case where the configuration using the posterior probability information is applied to the creation of the estimated LLR table based on the configuration according to the second embodiment is illustrated, but the configuration as a base is not limited to the second embodiment. For example, this embodiment may be applied to the configuration according to the third or fourth embodiment.

Sixth Embodiment

A memory system according to a sixth embodiment will be described in detail with reference to the drawings. In the following description, the same configurations and operations as those of the fifth embodiment are referred to, and redundant description thereof is omitted.

The fifth embodiment has a configuration in which the frequency is totalized by excluding the posterior LLR with low reliability (for example, the posterior LLR whose absolute value is equal to or less than a predetermined threshold). In such a configuration, the number of samples used to create the estimated LLR table is reduced, and it may not be possible to create an estimated LLR table that succeeds in decoding more stably. In contrast, in the sixth embodiment, the posterior LLR with low reliability is used for totalization without being excluded. With this configuration, it is possible to create an estimated LLR table that increases the number of samples and succeeds in decoding more stably.

Similarly to the fifth embodiment, the memory system according to this embodiment may have the same configuration as that of the memory system 1 described with reference to FIG. 1 in the first embodiment. However, in this embodiment, the soft-decision decoder 182-5 of the fifth embodiment described with reference to FIG. 15 is replaced with a soft-decision decoder 182-6 illustrated in FIG. 18.

Figure 18:
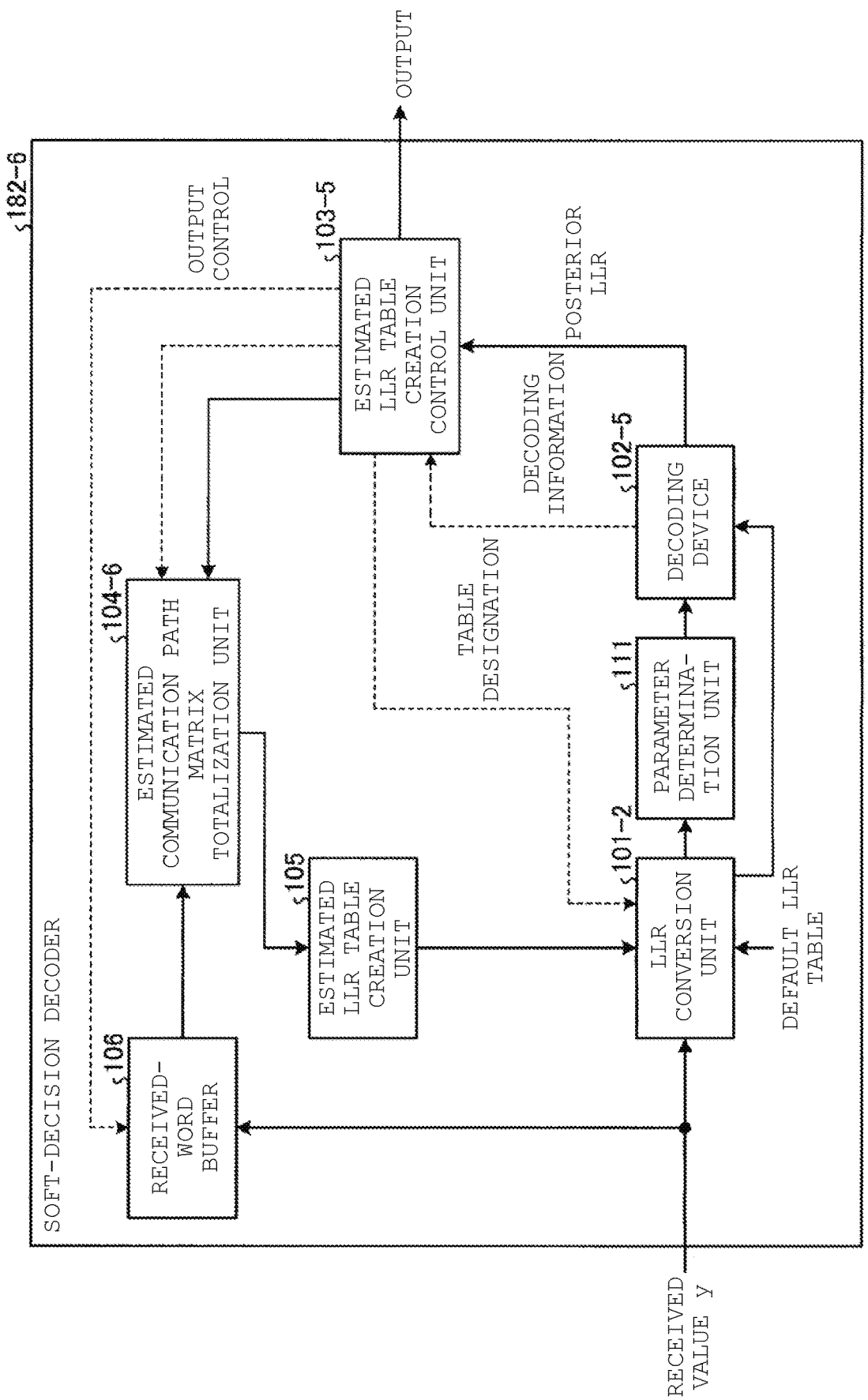
FIG. 18 is a block diagram illustrating an example of a more detailed configuration of a soft-decision decoding unit according to a sixth embodiment.

As illustrated in FIG. 18, the soft-decision decoder 182-6 according to this embodiment has the same configuration as the soft-decision decoder 182-5 illustrated in FIG. 15, but the estimated communication path matrix totalization unit 104 in FIG. 15 is replaced with an estimated communication path matrix totalization unit 104-6 illustrated in FIG. 18.

For bits with relatively low reliability (absolute value of the posterior LLR is small), the estimated communication path matrix totalization unit 104-6 converts a scale value (first scale value) of a counter that counts the frequency (number of appearances) so as to be a value equal to or less than a scale value (second scale value) of the counter for bits with relatively high reliability. The scale value is a value corresponding to the minimum unit (scale) of the counter. The estimated communication path matrix totalization unit 104-6 determines that the reliability is low, for example, when the absolute value of the posterior LLR is equal to or less than a predetermined threshold, and determines that the reliability is high when the absolute value of the posterior LLR is greater than the predetermined threshold. The estimated communication path matrix totalization unit 104-6 uses a counter that may also add a fractional value.

Figure 19:
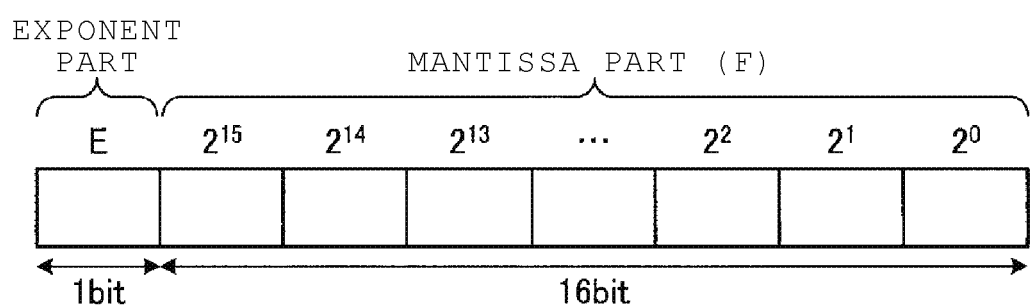
FIG. 19 is a diagram illustrating a configuration example of a counter used in the sixth embodiment.

FIG. 19 is a diagram illustrating a configuration example of a counter used in this embodiment. In the example of FIG. 19, the size of the counter is 17-bit long. The leftmost 1 bit corresponds to the exponent part, and the remaining 16 bits correspond to the mantissa part. If the exponent part is E and the mantissa part is F, the value of the counter is represented by $2^{S(E-1)} \times F$.

S is a numerical value (for example, a natural number) that determines a scale value, and is represented by $2^{-S}$, for example. When the scale value is $2^{-S}$, the range of values that may be expressed by the counter of FIG. 19 is $2^{-S}$ to $(2^{16-S}-1)$. The minimum unit of the counter for values less than $2^{16-S}$ is $2^{-S}$. The minimum unit of the counter for values equal to or greater than $2^{16-S}$ is 1. For example, when S=5, the scale value is $2^{-5}$ (=0.03125). The minimum unit of the counter for values less than $2^{16-S}=2^{11}=2048$ is $2^{-5}$. The minimum unit of the counter for values equal to or greater than $2^{11}$ is 1.

The configuration of the counter is not limited to the example of FIG. 19, and may be any configuration. FIG. 19 illustrates an example of a counter representing a floating point, but the counter may be a counter representing a fixed point. Although the configuration of the counter becomes complicated to be able to express the decimal point, an increase in the circuit scale necessary for the counter can be prevented, for example, with the configuration illustrated in FIG. 19. The scale value of the counter is not limited to a configuration in which the scale value of the counter is 1 for the scale value (second scale value) for bits with relatively high reliability, and the scale value (first scale value) for bits with relatively low reliability is less than or equal to 1, and may be in any relationship that satisfies first scale value ≤ second scale value.

Figure 20:
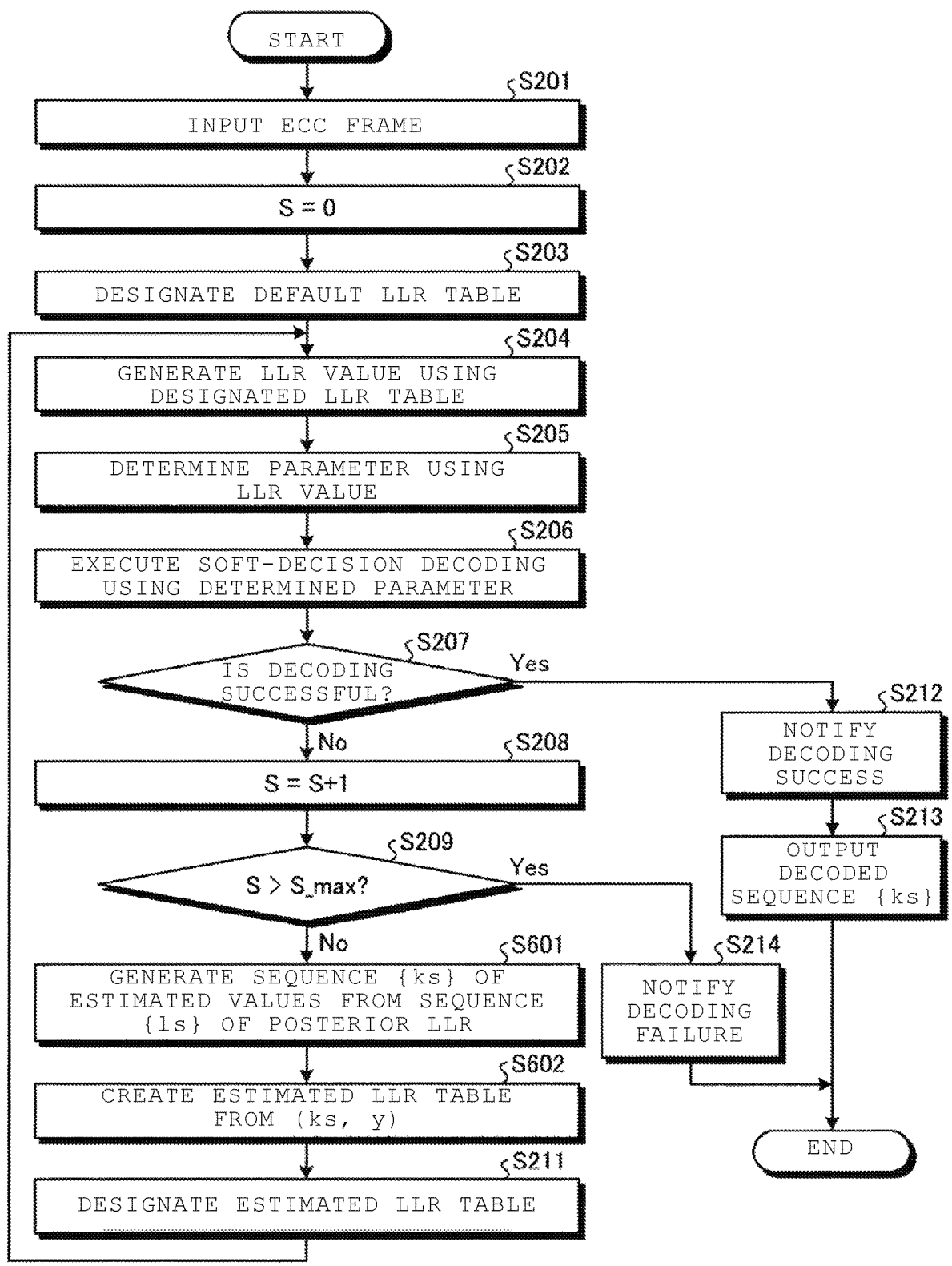
FIG. 20 is a flowchart illustrating an example of a decoding operation according to the sixth embodiment.

FIG. 20 is a flowchart illustrating an example of the decoding operation according to this embodiment. As illustrated in FIG. 20, in the decoding operation according to this embodiment, steps S501 to S503 are replaced with steps S601 to S602 in the same operation as the decoding operation according to the fifth embodiment illustrated in FIG. 17. In step S206, as in the fifth embodiment, the sequence $\{l_s\}$ of posterior LLRs is output as the decoding result instead of the estimated value sequence $\{k_s\}$.

When it is determined that the decoding in step S206 fails (NO in step S207) and the count value S indicating the number of repetitions is equal to or less than the maximum value S_max (NO in step S209), the estimated LLR table creation control unit 103-5 generates the sequence $\{k_s\}$ of estimated values for the sequence $\{l_s\}$ of posterior LLRs obtained by the decoding in step S206 (step S601).

The generated sequence $\{k_s\}$ of estimated values is input to estimated communication path matrix totalization unit 104-6. In step S502, the estimated communication path matrix totalization unit 104-6 creates the $(k_s, y)$ pair from the sequence $\{k_s\}$ of estimated values input from the estimated LLR table creation control unit 103-5 and the sequence $\{y\}$ of received values y input from the received-word buffer 106, totalizes the frequency of each created set, creates the frequency distribution or estimated communication path matrix based on the totalization result, and inputs the created estimated communication path matrix or frequency distribution to the estimated LLR table creation unit 105.

In this case, the estimated communication path matrix totalization unit 104-6 adds a value obtained by multiplying 1 by a scale value (for example, $2^{-5}$) as described with reference to FIG. 19 as a frequency, for the posterior LLR whose absolute value is equal to or less than a predetermined threshold.

The estimated LLR table creation unit 105 creates an estimated LLR table by using, for example, the expressions (3) to (6) described above based on the input estimated communication path matrix or frequency distribution. The created estimated LLR table is input to the LLR conversion unit 101-2.

The estimated LLR table creation unit 105 may calculate the LLR value after adding a predetermined correction value greater than 0 to the value of the frequency distribution. The following expression (7) is an example of an LLR value calculation expression that may be used in this case. In the expression (7), the correction value is 1, while the correction value may be other than 1 as long as it is a value greater than 0.

[Expression 7]

$$LLR(y) = \ln\left(\frac{(F(x=0, y)+1)/\sum_{y'}(F(x=0, y')+1)}{(F(x=1, y)+1)/\sum_{y'}(F(x=1, y')+1)}\right) \quad (7)$$

By adding the correction value, division by 0 can be avoided when the frequency is 0. The method for avoiding division by 0 is not limited thereto, and, for example, when the divisor is 0, a method of performing computation by replacing the divisor with 1 may be applied. Such a method for avoiding division by 0 may be applied not only to this embodiment but also to the second to fifth embodiments.

The example using the absolute value of the posterior LLR as the reliability is described so far, but is not limited thereto. For example, as in the second to fourth embodiments, the decoding device 102-2 that outputs the estimated value k is further configured to output the reliability of the estimated value k, and the estimated communication path matrix totalization unit 104-6 may be configured to use the reliability output from the decoding device 102-2.

The reliability may be represented by, for example, a binary flag (low reliability flag) of 0 and 1. For example, the low reliability flag indicates that the reliability is high when the value is 0, and indicates that the reliability is low when the value is 1. In this case, for the bits with the low reliability flag of 1, the estimated communication path matrix totalization unit 104-6 converts the scale value of the counter that counts the frequency so as to be equal to or less than the scale value of the counter for the bits with the low reliability flag of 0.

The reliability need not be a binary value of low or high, and may be represented by a ternary or higher value. For example, a flag having three values of 0 of high reliability, 1 of medium reliability, and 2 of low reliability may be used as the reliability. In this case, the estimated communication path matrix totalization unit 104-6 totalizes the frequencies using different scale values according to the flag values. For example, the estimated communication path matrix totalization unit 104-6 converts and totalizes the value of the counter for counting the frequency using the scale value S1, for the bits with flag of 1. The estimated communication path matrix totalization unit 104-6 converts and totalizes the value of the counter for counting the frequency using the scale value S2 (<S1) for the bits with flag of 2.

When the absolute value of the posterior LLR is used as the reliability, the number of appearances may be totalized using different scale values according to the comparison result between the absolute value and two or more thresholds. For example, when two thresholds of a threshold 1 of 2 and a threshold 2 of 4 are used, if the absolute value is greater than 2 and less than or equal to 4, the counter value is converted and totalized using the scale value S1, and if absolute value is less than or equal to 2, the counter value is converted and totalized using the scale value S2 (<S1).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory in which data encoded with an error correction code are stored; and
a memory controller configured to:
read data from the nonvolatile memory,
calculate likelihood information from the read data and a log-likelihood ratio (LLR) table for calculating the likelihood information,
determine a parameter for a decoding process of the read data based on the likelihood information, wherein the parameter comprises a range of symbols to be inverted in the read data,
execute the decoding process based on the determined parameter, and
output a decoding result obtained by the decoding process.

2. The memory system according to claim 1, wherein the memory controller executes the decoding process based on data obtained by inverting a predetermined number of symbols among the range of symbols.

3. The memory system according to claim 2, wherein
the memory controller determines the range of symbols based on a percentage of the number of symbols whose absolute value of the likelihood information is equal to or less than a threshold to a total number of symbols included in the read data.

4. The memory system according to claim 3, wherein
the memory controller determines the range of symbols to be a larger value as the percentage increases.

5. The memory system according to claim 3, wherein
the memory controller determines, as the range of symbols, a value based on a product of a code length of the error correction code and the percentage.

6. The memory system according to claim 5, wherein
the memory controller calculates a correction value based on a standard deviation of the number of symbols whose absolute value of the likelihood information is equal to or less than the threshold, and determines a value obtained by correcting the product with the correction value as the range.

7. The memory system according to claim 6, wherein
the memory controller determines the range to be a larger value as the correction value increases.

8. The memory system according to claim 1, wherein
the memory controller creates the LLR table based on the read data and the decoding result and converts the read data into the likelihood information using the LLR table.

9. The memory system according to claim 1, wherein the error correction code is a Bose-Chaudhuri-Hocquenghem (BCH) code or a Reed-Solomon (RS) code.

10. The memory system according to claim 1, wherein
the error correction code is a product code, and each of a component code in a row direction and a component code in a column direction constituting the product code is a BCH code or an RS code.

11. The memory system according to claim 1, wherein
the decoding process employs ordered statistics decoding (OSD).

12. The memory system according to claim 1, wherein
the decoding process employs Chase decoding.

13. The memory system according to claim 1, wherein
in the decoding process, at least one of OSD and Chase decoding is repeatedly executed.

14. The memory system according to claim 1, wherein
the memory controller creates an LLR table based on the decoding result and converts the read data into the likelihood information using the created LLR table, when the decoding process fails to decode the read data.

15. The memory system according to claim 1, wherein the decoding process comprises a soft decoding process.

16. A memory system comprising:
a nonvolatile memory in which data encoded with an error correction code are stored; and
a memory controller configured to
read data from the nonvolatile memory,
calculate likelihood information from the read data and a first log-likelihood ratio (LLR) table for calculating the likelihood information,
determine a parameter for a decoding process of the read data based on the likelihood information, execute the decoding process based on the determined parameter, if the decoding process is successful, notify a decoding success and output a decoding result obtained by the decoding process, and if the decoding process is unsuccessful, create an estimated LLR table as a second LLR table from information obtained from the unsuccessful decoding process and the first LLR table, and designate the second LLR table for future decoding processes.

17. The memory system of claim 16, wherein the estimated LLR table is created using a frequency of each (ks, y) pair of estimated decoded sequence ks and received read data sequence y.

18. The memory system of claim 16, wherein if the decoding process is unsuccessful, an estimated LLR table is created up to M times consecutively, M being a positive integer greater than one, and if the decoding process is still unsuccessful up to creation of the M-th LLR table, a decoding failure is output.

19. The memory system according to claim 16, wherein the decoding process comprises a soft decoding process.

20. The memory system according to claim 16, wherein the parameter comprises a range of symbols to be inverted in the read data, and the memory controller executes the decoding process based on data obtained by inverting a predetermined number of symbols among the range of symbols.

* * * * *